United States Patent
Elwell

(10) Patent No.: US 10,351,050 B1
(45) Date of Patent: Jul. 16, 2019

(54) EMERGENCY OR WORK RELATED LIGHT BAR

(71) Applicant: Putco, Inc., Des Moines, IA (US)

(72) Inventor: James P. Elwell, Grimes, IA (US)

(73) Assignee: Putco, Inc., Des Moines, IA (US)

( * ) Notice: Subject to any disclaimer, the term of this patent is extended or adjusted under 35 U.S.C. 154(b) by 0 days.

(21) Appl. No.: 16/176,112

(22) Filed: Oct. 31, 2018

(51) Int. Cl.
| | |
|---|---|
| *F21S 4/28* | (2016.01) |
| *B60Q 1/22* | (2006.01) |
| *B60Q 1/26* | (2006.01) |
| *H05B 33/08* | (2006.01) |
| *H01L 27/15* | (2006.01) |
| *F21S 41/141* | (2018.01) |

(52) U.S. Cl.
CPC ............. *B60Q 1/22* (2013.01); *B60Q 1/2696* (2013.01); *F21S 41/141* (2018.01); *H01L 27/153* (2013.01); *H05B 33/083* (2013.01)

(58) Field of Classification Search
None
See application file for complete search history.

(56) References Cited

U.S. PATENT DOCUMENTS

| | | | |
|---|---|---|---|
| 8,004,394 B2 * | 8/2011 | Englander | B60Q 1/24 340/433 |
| 2002/0105432 A1 * | 8/2002 | Pederson | B60Q 1/2611 340/815.45 |
| 2009/0273941 A1 * | 11/2009 | Englander | B60Q 1/24 362/464 |
| 2013/0311035 A1 * | 11/2013 | Czyz | B60Q 1/0023 701/36 |
| 2015/0266411 A1 * | 9/2015 | Bennie | B60W 10/06 701/36 |

\* cited by examiner

*Primary Examiner* — Elmito Breval
(74) *Attorney, Agent, or Firm* — McKee, Voorhees & Sease, PLC

(57) ABSTRACT

A light bar has a circuit board positioned within a housing and having a plurality of light emitting diodes (LEDs) configured to transmit light from an outward facing surface of the circuit board. The housing has wiring electrically connected to a controller. The controller is configured to receive signals from the electrical system of the vehicle, interpret the signals received from the electrical system of the vehicle, and in response automatically control illumination of independently controllable segments of the vehicle light bar. An override mechanism within the controller allows an operator to manually override the automatic response to control illumination of the independently controllable segments with a selected strobing pattern. The override mechanism may be tied into the electrical system of the vehicle such that both the LEDs on the vehicle light bar and the external lights of the vehicle are synced.

20 Claims, 17 Drawing Sheets

EMERGENCY OR WORK RELATED LIGHT BAR

FIELD OF THE INVENTION

This invention relates to lights. More specifically, and without limitation, this invention relates to a light bar which is particularly well suited for use on trucks in a low-profile manner in the space above a bumper and below the tailgate.

BACKGROUND OF THE INVENTION

The background description provided herein is for the purpose of generally presenting the context of the present disclosure. Work of the presently named inventors, to the extent the work is described in the present disclosure, as well as aspects of the description that may not otherwise qualify as prior art at the time of filing, are neither expressly nor impliedly admitted as prior art.

Vehicle lights are old and well known. Countless forms of vehicle lights exist, including: headlights, fog lights, tail lights, reverse lights, parking lights, daytime running lights, and turning lights, among countless others. Each type of light or light configuration serves its own unique purpose and provides its own unique advantages.

With improvements in light technology, such as the development of light emitting diodes ("LEDs"), a great variety of accessory lights have been developed. These accessory lights come in a wide array of configurations and provide their own unique functions and advantages.

One common form of an accessory light is known as a light bar. Light bars are designed to fit in the small space between the upper edge of the bumper and the lower edge of the tailgate of a pickup truck and include a long array of lights that are electrically connected to the electrical system of the vehicle. These light bars provide improved illumination and thereby improve visibility when breaking, turning and backing up.

While conventional light bars provide many advantages, they suffer from many disadvantages not solved by the prior art. Namely, the lighting patterns and capabilities of known light bars are either manually set by an operator of the vehicle or interpreted in response to signals directly received from the electrical system of the vehicle, thereby controlling illumination of the LEDs of the light bar. No known light bars include the option to manually set a lighting pattern while simultaneously interpreting signals directly received from the electrical system of the vehicle. Furthermore, there are no known light bars which reconcile whether a manual instruction from an operator of the vehicle or an automatic system for interpreting signals directly received from the electrical system of the vehicle should have priority over the other during simultaneous use.

There exists a need in the art for a light bar that allows the operator to send an input to the light bar for a specific pattern of lights while the light bar simultaneously interprets signals directly received from the electrical system. There exists a further need in the art for a light bar which harmonizes which lights should light up in the event these instructions conflict with one another.

BRIEF SUMMARY OF THE INVENTION

Therefore, it is a primary object, feature, or advantage of the invention to improve on or overcome the deficiencies in the art.

It is still yet a further object, feature, or advantage of the invention to provide a light bar that may be used in a wide variety of applications and may be implemented on and used universally with almost any vehicle, including police cars, fire trucks, security vehicles, and ambulances.

It is still yet a further object, feature, or advantage of the invention to provide a light bar having LEDs of various colors. For example, the light bar may include white LEDs, red LEDs, amber LEDs, blue LEDs, green LEDs, etc. The light bar may include solid or split color variations, and the color variations may be changeable by remote control.

It is still yet a further object, feature, or advantage of the invention to provide a light bar having a solid state design. For example, the light bar includes more than two thousand chip-on-board LEDs, a compact size, and a completely encapsulated interior.

It is still yet a further object, feature, or advantage of the invention to provide a semi-flexible or flexible light bar for allowing installation on gradually curved surfaces.

It is still yet a further object, feature, or advantage of the invention to provide light bars of various sizes that fit in the space between the bumper and the tailgate of most trucks, mount inside the vehicle in various window locations or outside of the vehicle at any external location on the vehicle and are included with tool boxes or other objects associated with the vehicle.

It is still yet a further object, feature, or advantage of the invention to provide a clip for mounting the light bar to any of the locations listed above or any other suitable location on a vehicle.

It is still yet a further object, feature, or advantage of the invention to provide a light bar that improves the safety of drivers.

It is still yet a further object, feature, or advantage of the invention to a light bar that is cost effective.

It is another object, feature, or advantage of the invention to provide a light bar that is reliable, durable, and has a long useful life.

It is another object, feature, or advantage of the invention to provide a light bar that is water, weather, and contaminant proof.

It is still yet a further object, feature, or advantage of the present invention to provide an apparatus which may be easily used and reused.

It is still yet a further object, feature, or advantage of the invention to provide a light bar that can be easily manufactured, transported, installed, uninstalled, repaired, replaced, assembled, disassembled, stored, and cleaned.

It is still yet a further object, feature, or advantage of the invention to provide a light bar that is aesthetically pleasing.

It is still yet a further object, feature, or advantage of the present invention to incorporate an apparatus into a system accomplishing some or all of the previously stated objectives.

It is still yet a further object, feature, or advantage of the present invention to provide methods of using, manufacturing, installing, and repairing an apparatus accomplishing some or all of the previously stated objectives.

The following provides a list of aspects or embodiments disclosed herein and does not limit the overall disclosure. It is contemplated that any of the embodiments disclosed herein can be combined with other embodiments, either in full or partially, as would be understood from reading the disclosure.

According to some aspects of the present disclosure, a vehicle light bar comprises a circuit board positioned within a housing and having a plurality of light emitting diodes (LEDs) configured to transmit light from an outward facing surface of the circuit board, the housing having wiring electrically connected to a control box, said control box including logic for automatically illuminating independently controllable segments of the vehicle light bar and a microprocessor programmed to override the automatic illumination of the independently controllable segments of the vehicle light bar.

According to some additional aspects of the present disclosure, space between the outward facing surface of the circuit board and an inward facing surface of the housing is filled with an encapsulant thereby sealing the LEDs within the housing.

According to some additional aspects of the present disclosure, the encapsulant is formed of a flowable plastic injected into space between the outward facing surface of the circuit board and the inward facing surface of the housing.

According to some additional aspects of the present disclosure, a portion of the housing covering the LEDs is formed of a transparent or translucent plastic material.

According to some additional aspects of the present disclosure, the housing is formed of a back wall, a pair of opposing sidewalls and a cover, wherein the cover is formed of a convex curved shape.

According to some additional aspects of the present disclosure, the outward facing surface of the circuit board is black in color thereby minimizing the noticeability of the vehicle light bar when not in operation.

According to some additional aspects of the present disclosure, the LEDs are chip-on-board LEDs.

According to some additional aspects of the present disclosure, the wiring includes a fuse and a signal lead.

According to some additional aspects of the present disclosure, the wiring comprises gold.

According to some additional aspects of the present disclosure, the circuit board includes three rows of LEDs, wherein at least one row is formed of red LEDs, at least one row is formed of amber LEDs, and at least one row is formed of white LEDs.

According to some additional aspects of the present disclosure, the control box is initially configured to automatically illuminate some of the red LEDs while a vehicle is braking, illuminate some of the amber LEDs while the vehicle is turning, and illuminate some of the white LEDs while the vehicle is driven in reverse.

According to some additional aspects of the present disclosure, a manual instruction sent from an operator instructs the microprocessor to override the automatic illumination of independently controllable segments of the vehicle light bar with a strobing pattern selected from the group consisting of an emergency strobing pattern and a work light strobing pattern.

According to some additional aspects of the present disclosure, a wireless remote sends an input containing the manual instruction to the vehicle light bar.

According to some other aspects of the present disclosure, a method of manufacturing a vehicle light bar comprises positioning a circuit board having a plurality of light emitting diodes (LEDs) configured to transmit light from an outward facing surface of the circuit board within a housing, filling the space between the outward facing surface of the circuit board and an inward facing surface of the housing with an encapsulant, sealing the LEDs within the housing, providing a control box including logic for automatically illuminating independently controllable segments of the vehicle light bar and a microprocessor programmed to override the automatic illumination of the independently controllable segments of the vehicle light bar, and electrically separating the circuit board into independently controllable segments.

According to some additional aspects of the present disclosure, the filling step comprises flowing a first layer of encapsulant over the outward facing surface of the circuit board having a plurality of LEDs and allowing the first layer of encapsulant to cure thereby sealing the LEDs of the circuit board prior to positioning the circuit board within the housing.

According to some additional aspects of the present disclosure, the filling step further comprises flowing a second layer of encapsulant into the housing after the circuit board is positioned within the housing.

According to some other aspects of the present disclosure, a vehicle light bar for installation on a vehicle having an electrical system comprises a circuit board positioned within a housing and having a plurality of light emitting diodes (LEDs) configured to transmit light from an outward facing surface of the circuit board, and a controller electrically connected to the electrical system of the vehicle, electrically connected to the vehicle light bar, and having a microprocessor and memory. The controller is configured to receive signals from the electrical system of the vehicle, interpret the signals received from the electrical system of the vehicle, and in response automatically control illumination of independently controllable segments of the vehicle light bar. The controller includes logic for automatically illuminating independently controllable segments of the vehicle light bar and a microprocessor programmed to override the automatic illumination of the independently controllable segments of the vehicle light bar.

According to some additional aspects of the present disclosure, the controller is further configured to select between colors of LEDs in response to receiving the signals from the electrical system of the vehicle.

According to some additional aspects of the present disclosure, the controller is further configured to select the duration of illumination of LEDs in response to receiving the signals from the electrical system of the vehicle.

According to some additional aspects of the present disclosure, the logic is tied into the electrical system of the vehicle such that both the LEDs on the vehicle light bar and the external lights of the vehicle are synced.

These or other objects, features, and advantages of the present invention will be apparent to those skilled in the art after reviewing the following detailed description of the illustrated embodiments, accompanied by the attached drawings.

Figure 1:
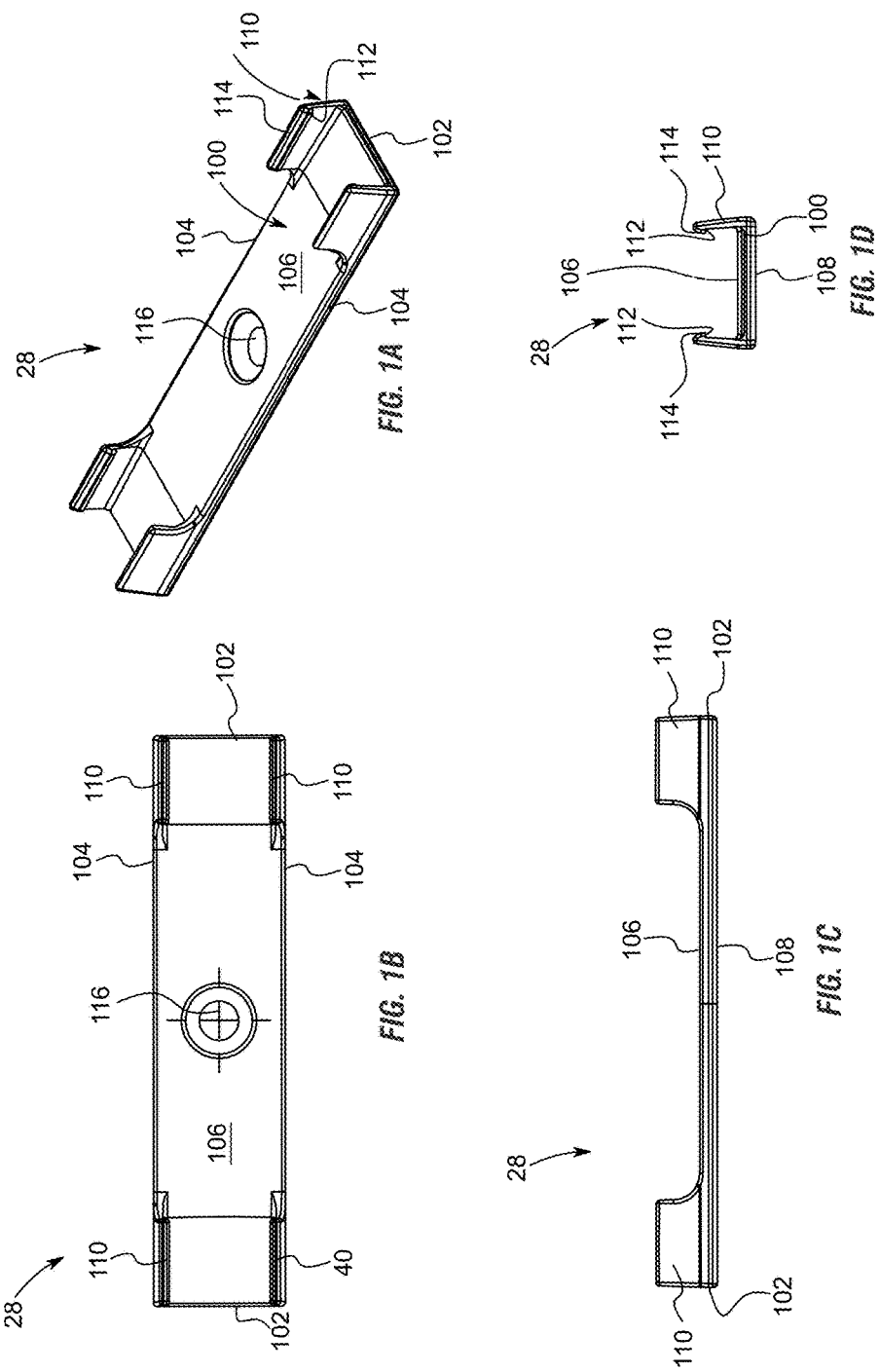
FIG. 1A is a perspective view of a clip for use with the vehicle light bar system presented herein, the clip is configured to attach to the body of a vehicle using adhesive and/or a fastener, the clip includes a back wall that is generally planar in shape and includes opposing arms positioned in each corner of the back wall that extend upward therefrom, the arms include a feature positioned at the outward end of opposing arms that extend toward one another, this feature is configured to grip onto the light bar when the light bar is forced between the opposing arms thereby holding the light bar within the clip, the outward ends of the arms also include a guiding surface angles toward the open interior of the clip that is configured to guide the light bar between opposing arms.
FIG. 1B is an elevation view of the clip shown in FIG. 1A, the view taken from the top surface of the clip.
FIG. 1C is an elevation view of the clip shown in FIGS. 1A and 1B, the view taken from the side surface of the clip, the view showing the arms extending upward a distance from the back wall.
FIG. 1D is an elevation view of the clip shown in FIGS. 1A, 1B, and 1C, the view taken from the end of the clip, the view showing the distance between opposing arms that extend upward a distance from the back wall; the view showing the feature positioned at the outward end of opposing arms that extend toward one another, this feature is configured to grip onto the light bar when the light bar is forced between the opposing arms thereby holding the light bar within the clip, the view also shows the guiding surface positioned at the outward ends of the arms that angles toward the open interior of the clip that is configured to guide the light bar between opposing arms.

Various embodiments of the present disclosure illustrate specific embodiments in which the present invention may be practiced. These embodiments of the present invention will be described in detail with reference to the drawings, wherein like reference numerals represent like parts throughout the several views. Reference to various embodiments does not limit the scope of the present disclosure and the drawings represented herein are presented for exemplary purposes.

DETAILED DESCRIPTION

The following definitions and introductory matters are provided to facilitate an understanding of the present invention. Unless defined otherwise, all technical and scientific terms used herein have the same meaning as commonly understood by one of ordinary skill in the art to which embodiments of the present invention pertain.

The terms "a," "an," and "the" include plural referents unless context clearly indicates otherwise. Similarly, the word "or" is intended to include "and" unless context clearly indicate otherwise. The word "or" means any one member of a particular list and also includes any combination of members of that list.

The terms "invention" or "present invention" as used herein are not intended to refer to any single embodiment of the particular invention but encompass all possible embodiments as described in the specification and the claims.

The term "about" as used herein refers to variation in the numerical quantities that can occur, for example, through typical measuring techniques and equipment, with respect to any quantifiable variable, including, but not limited to, mass, volume, time, distance, wave length, frequency, voltage, current, and electromagnetic field. Further, given solid and liquid handling procedures used in the real world, there is certain inadvertent error and variation that is likely through differences in the manufacture, source, or purity of the ingredients used to make the compositions or carry out the methods and the like. The claims include equivalents to the quantities whether or not modified by the term "about."

The term "configured" describes an apparatus, system, or other structure that is constructed or configured to perform a particular task or to adopt a particular configuration. The term "configured" can be used interchangeably with other similar phrases such as constructed, arranged, adapted, manufactured, and the like.

Terms such as first, second, vertical, horizontal, top, bottom, upper, lower, front, rear, end, sides, concave, convex, and the like, are referenced according to the views presented. These terms are used only for purposes of description and are not limiting. Orientation of an object or a combination of objects may change without departing from the scope of the invention.

The apparatuses, systems, and methods of the present invention may comprise, consist essentially of, or consist of the components of the present invention described herein. The term "consisting essentially of" means that the apparatuses, systems, and methods may include additional components or steps, but only if the additional components or steps do not materially alter the basic and novel characteristics of the claimed apparatuses, systems, and methods.

The following embodiments are described in sufficient detail to enable those skilled in the art to practice the invention however other embodiments may be utilized. Mechanical, procedural, and other changes may be made without departing from the spirit and scope of the invention. Accordingly, the scope of the invention is defined only by the appended claims, along with the full scope of equivalents to which such claims are entitled.

The light bar described herein is described, as one example, for use with a pickup truck. This is by way of example only, and any use is hereby contemplated and reference to use on a pickup truck is not to be limiting. Instead, the light bar presented herein is contemplated for use in any application and may be used on any vehicle. In addition, the shape and dimensions of the light bar can be modified without departing from the spirit and scope of the invention.

System:

With reference to the figures, light bar system 10 is presented (also referred to herein as light bar 10 and/or system 10). The system 10 includes the component pieces of housing 12, circuit board 14 which is separated into segments 16, end caps 18, encapsulant 20, control box 22 having a microprocessor 24 and memory 26, among other components as is described herein. The system 10 also includes one or more clips 28 that facilitate connection of the light bar 10 to a truck or vehicle 30 (not shown in detail).

Housing:

Housing 12 is formed of any suitable size, shape and design and is configured to house the electrical components of the light bar system 10. In one arrangement, as is shown, housing 12 is an elongated hollow member that extends a length between opposing ends that are closed by end caps 18. Housing 12 includes a back wall 32 that is generally flat and planar in shape when viewed from the side. The upper and lower edges of back wall 32 that extend the length of housing 12 connect to opposing sidewalls 34. Like back wall 32, sidewalls 34 are generally flat and planar in shape. Opposing sidewalls 34 connect at their rearward edges to the upper and lower edges of back wall 32 and extend in approximate parallel spaced alignment to one another. Sidewalls 34 extend in approximate perpendicular alignment to back wall 32. This arrangement, with the generally planar and perpendicular alignment of the back wall 32 and side walls 34 form a generally rectangular space between the back wall 32 and opposing side walls 34, as can be seen from the side cut away view of FIGS. 3 and 4.

The forward edges of sidewalls 34 connect to a cover portion 36 of housing 12. In the arrangement shown, cover portion 36 has a generally smooth and curved exterior surface that connects at its upper and lower edges to the forward edges of sidewalls 34. In the arrangement shown, cover portion 36 has a convex exterior surface, and a concave interior surface, that helps to shed water, dirt and contaminants off of the housing. However, any other size, shape and design is contemplated for use as cover portion 36, including a flat and square shape, a peaked shape, a concave shape or any other shape.

Figure 3:
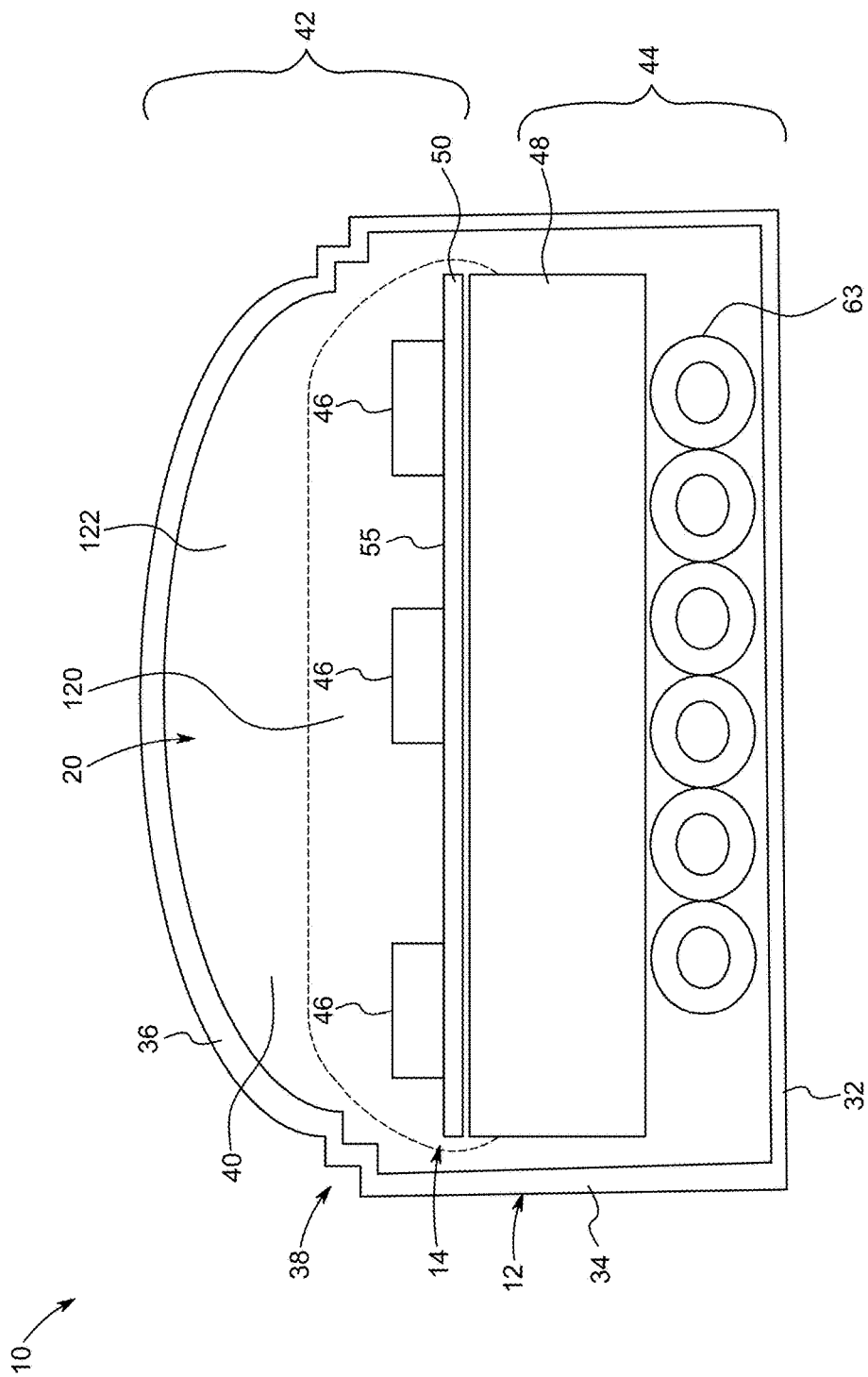
FIG. 3 is an elevation view of a side cut away of the assembled housing of the light bar, the view showing the housing having a back wall, opposing side walls and a cover with a pair of right angled steps that serve as features positioned between the cover and the sidewalls, the view showing the circuit board formed of a backing material, circuitry layer and LEDs positioned within the hollow interior of the housing, the view showing the ribbon wire extending below the backing material of the circuit board, the view showing the first layer of encapsulant encapsulating the outward facing surface of the circuit board including the three rows of LEDs, the view also showing the second layer of encapsulant the essentially fills all the remaining space within the hollow interior of the housing thereby fully encapsulating the circuit board and all other components positioned within the hollow interior of the housing.
Figure 4:
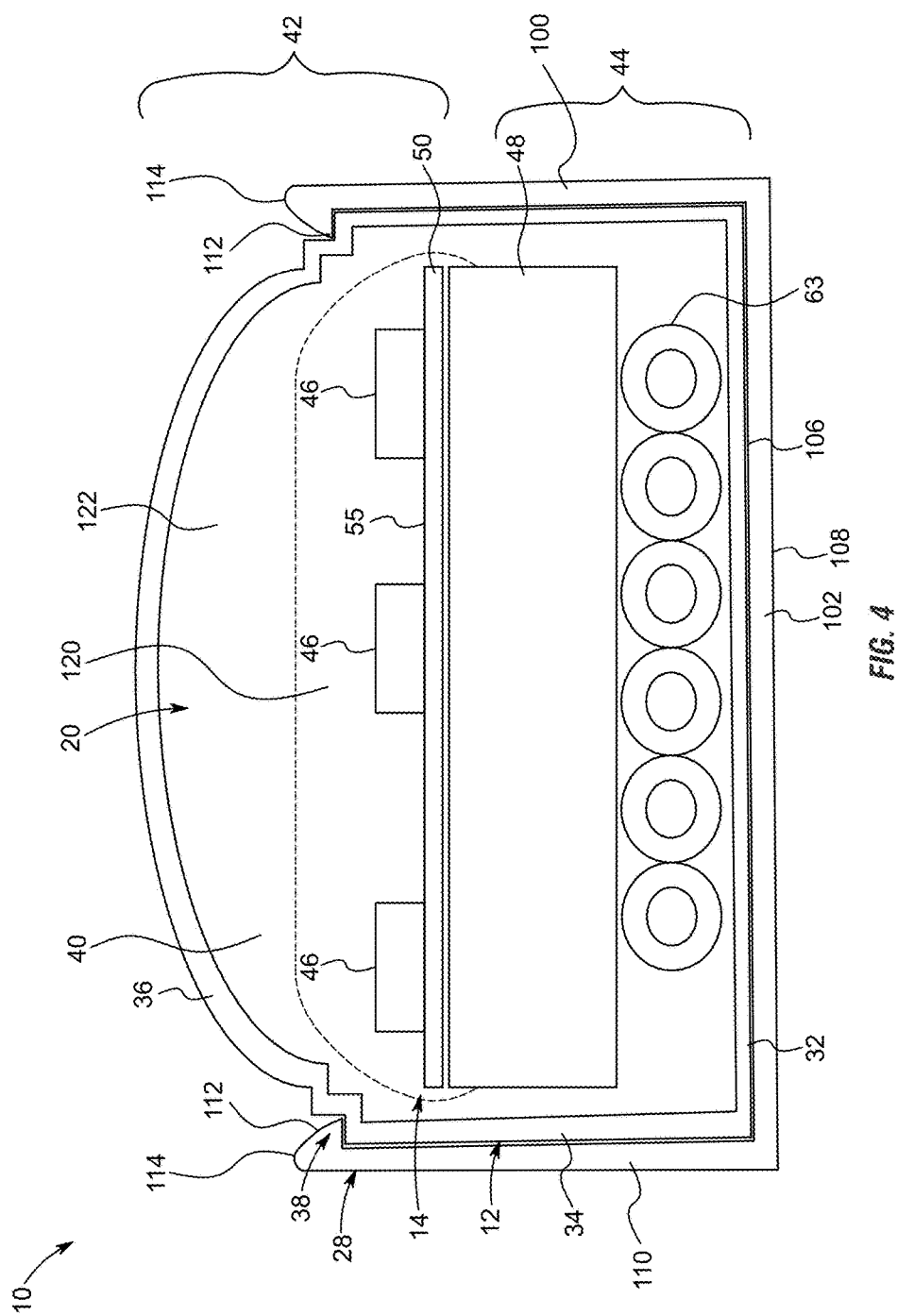
FIG. 4 is a side elevation view of a side cut away of the assembled housing of the light bar of FIG. 3, the view showing the addition of the clip shown in FIGS. 1A-1D attached to the exterior of the housing, the view showing the features of the arms of the clip connected to and holding onto the features of the housing positioned between the sidewalls of the housing and the cover of the housing, the view showing the interior surface of the sidewalls of the arms in approximately flat and flush engagement with the exterior surface of the sidewalls of the housing, the view showing the exterior surface of the back wall of the housing in approximately flat and flush engagement with the forward surface of the back wall of the clip.
Figure 5:
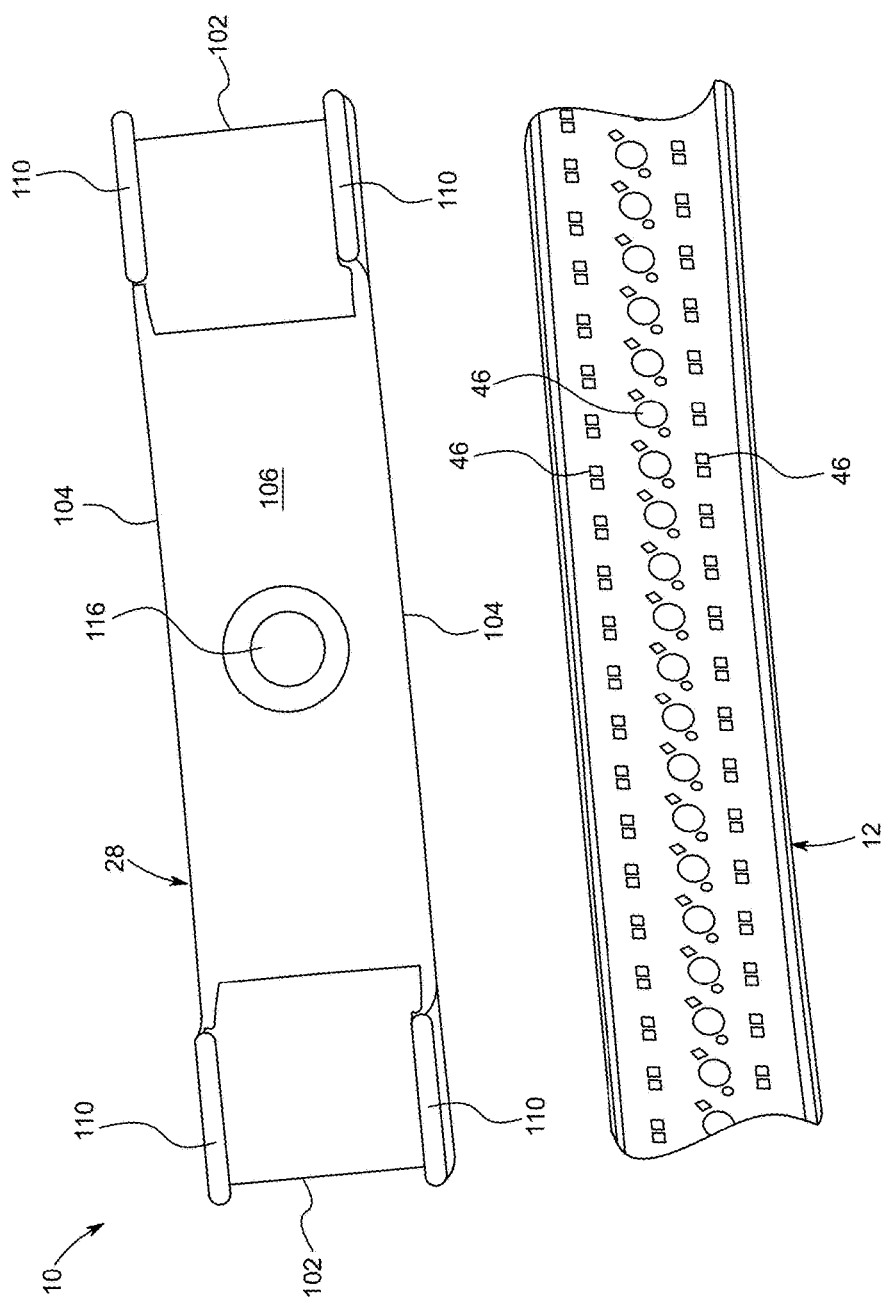
FIG. 5 is a perspective view of the clip of FIGS. 1A-1D shown in a side by side position to a portion of the housing of the light bar.
Figure 6:
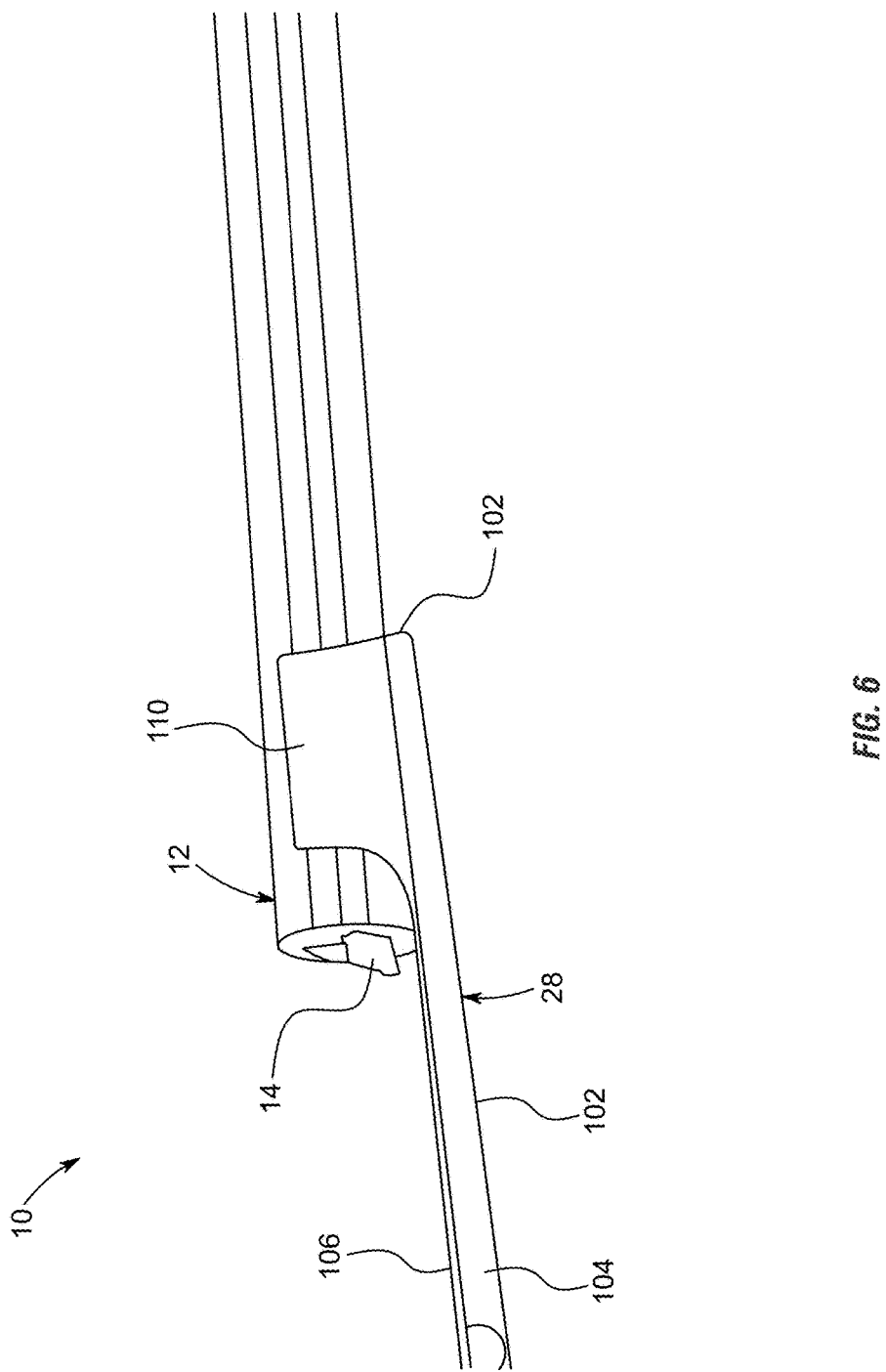
FIG. 6 is a perspective view of the clip of FIGS. 1A-1D shown partially installed on a portion of the housing of the light bar, the view showing one end of the light bar installed on the clip and one end of the light bar not installed on the clip.
Figure 7:
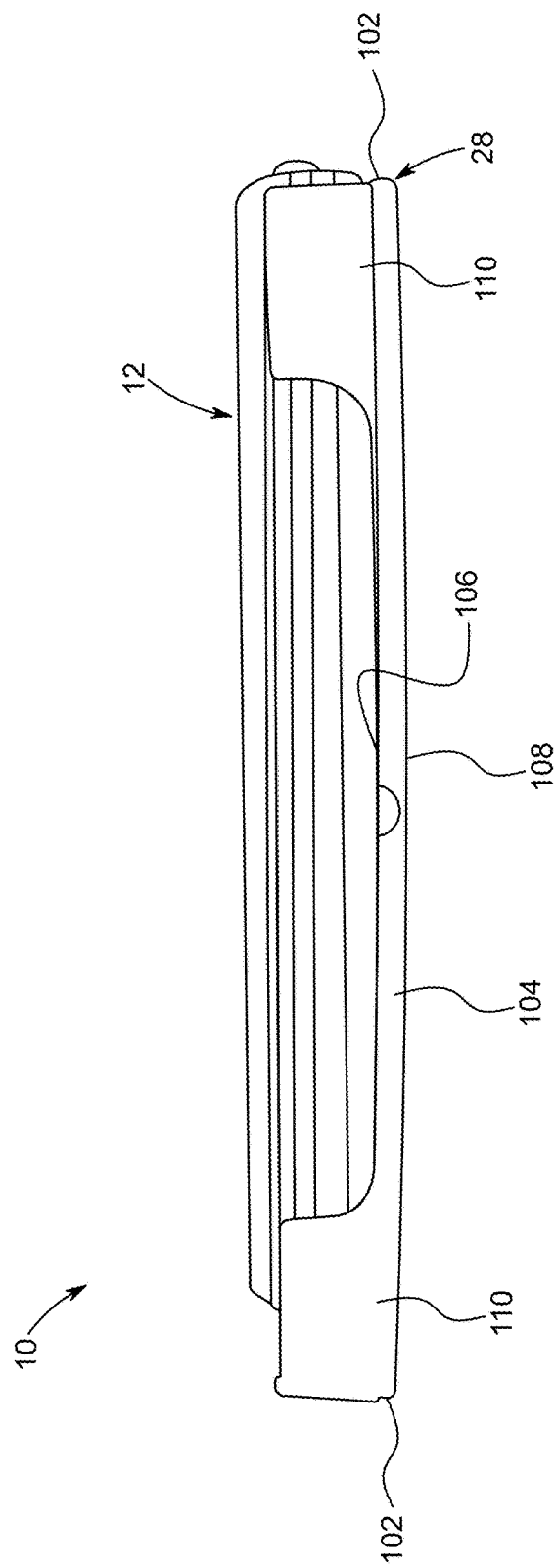
FIG. 7 is a perspective view similar to FIG. 6 with the portion of the housing fully installed within the clip.
Figure 8:
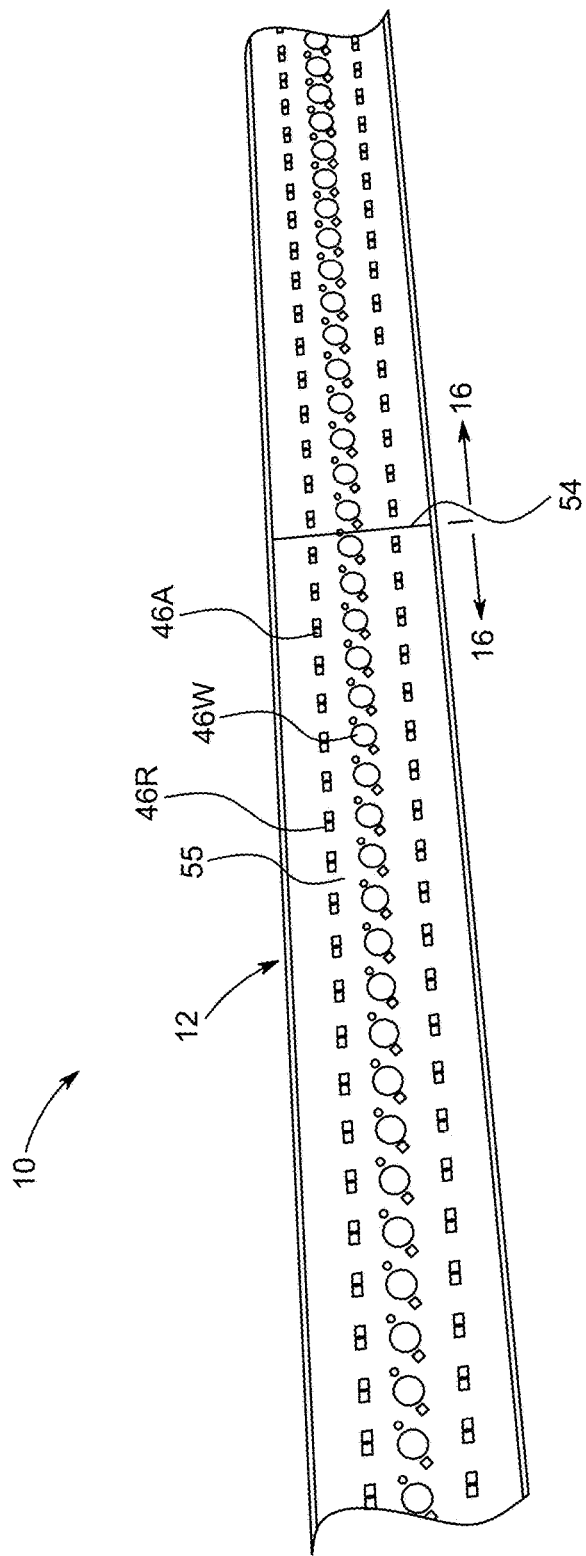
FIG. 8 is a perspective view of the fully assembled light bar, the view showing three rows of LEDs visible through the transparent portion of the housing, a row of red LEDs, a row of white LEDs and a row of amber LEDs.

In one arrangement, as is shown, one or more features 38 are positioned at the intersection or connection point between sidewalls 34 and cover portion 36. Features 38 are formed of any suitable size, shape and design and are configured to support the engagement between and connection of clip 28 to housing 12 and to facilitate a strong and durable hold there between while also facilitating selective removal of housing 12 from clip 28. As one example, as is shown, features 38 include a first step or ledge positioned between the exterior surface of sidewalls 34 and where cover portion 36 connects to sidewalls 34. In this arrangement, the first step of features 38 include a small generally planar portion that extends in approximate parallel spaced relation to back wall 32 which serves as a connection point for clip 28 to hold on to and secure housing 12. That is, in the arrangement shown, the first step of features 38 is a small generally right angle notch or step between sidewall 34 and cover portion 36 when viewed from the side as can be seen in FIGS. 3 and 4. Also, in the arrangement shown, a second step is also positioned just above the first step of features 38 and is configured in a similar manner. That is, in the arrangement shown, the second step of features 38 is a small generally right angle notch or step between sidewall 34 and cover portion 36 that connects at its lower or outward side to the first step of features and connects at its upper or outward side to cover portion 38 when viewed from the side as can be seen in FIGS. 3 and 4. In the arrangement wherein more than one step is present in features 38, clip 28 may connect to only one of the steps or both of the steps. Any number of steps is hereby contemplated for use as features 38 such as none, one, two, three, four or more. Alternatively, any other size, shape and design for features 38 is hereby contemplated for use, such as a hook, a concave recess that is recessed inward toward back wall 32, a protrusion or any other shaped feature 38, which in some configurations or applications may provide a more-affirmative and durable connection between clip 28 and housing 12.

The connection of back wall 32, sidewalls 34 and cover portion 36 define a hollow interior 40 there between which houses and holds circuit board 14 therein. In one arrangement, housing 12 is formed of a single monolithic piece or extrusion and therefore the features, size and shape of housing 12 extend the length of housing 12. Being formed of a single piece reduces the number of parts, simplifies the manufacturing process in many ways (and complicates it in other ways) and provides enhanced water proofing and contaminant protection as there are no seams or connection points for infiltration of water or contaminants into the hollow interior 30 of housing 12. As such, the hollow interior 40 of housing 12 serves as a complete or as close to a complete shield to water and contaminants as is possible. This arrangement provides enhanced the water and contaminant protection for the components positioned within the hollow interior 40 of housing 12. To provide further protection, the components positioned within the hollow interior 40 of housing 12 are encapsulated in an encapsulant 20 as is further described herein. Having a consistent size and shape throughout the length of housing 12 facilitates easier installation as clip 28 can be positioned along any portion of housing 12 and the components can be inserted into hollow interior 40 of housing 12 from either end and these components may be slid along the length of hollow interior 40 of housing 12 during installation.

In the arrangement shown, housing 12 includes a transparent portion 42 and a non-transparent portion 44. In one arrangement, the back wall 32 and the sidewalls 34 or only the rearward portions of sidewalls 34 of housing 12 are painted with a black or dark or non-transparent paint which is placed on the exterior and/or the interior of housing 12. Alternatively these portions of housing 12 (back wall 32 and all or a portion of sidewalls 34) are formed of a black or dark or non-transparent material that prevents or reduces light transmission there through. In this arrangement, the cover portion 36 and the forward portions of sidewalls 34 of housing 12 are formed of a clear, transparent, translucent or other material that allows light to be transmitted there through. In one arrangement, the color black has been tested with success as it reduces the appearance of the system 10 when installed on vehicle 30. In the arrangement where the back wall 32 and sidewalls 34 and the cover portion 36 are formed of different colored materials, the back wall 32 and sidewalls 34 are manufactured as a single unitary piece of two different colored materials or two materials with different colors and light-transmission properties, such as a co-extrusion process or the like so as to form a single unitary and simultaneously manufactured piece without seams or other areas where water or contaminants can infiltrate the housing 12.

In an alternative arrangement, housing 12 is formed multiple pieces. In one arrangement, a back portion or non-transparent portion 44, connects to a front portion or transparent portion 42 along a connection point or seamline that is glued, welded, adhered or connected in any other way to one another. In this arrangement, the back portion or non-transparent portion 44 is formed of a black or dark or non-transparent material or is painted with a black or dark or non-transparent paint, whereas the front portion or transparent portion 42 is formed of a transparent or translucent material that allows light to be transmitted there through. In one arrangement, the back portion or non-transparent portion 44 is formed of the back wall 32 and the entirety of the sidewalls 34 which connect to the cover portion 36 at the outward ends of sidewalls 34. In another arrangement, the back portion or non-transparent portion 44 is formed of the back wall 32 and a portion of the sidewalls 34 which connect to the cover portion 36 which includes a portion of the sidewalls 34 and as such, sidewalls 34 connect to one another along a seamline where the back portion of the sidewalls 34 are part of the nontransparent portion 44 and the forward portion of the sidewalls 34 are part of the transparent portion 42. Any other configuration is hereby contemplated for use.

Circuit Board:

Circuit board 14 is formed of any suitable size, shape and design and is configured to house a plurality of light emitting diodes 46 ("LEDs") thereon and facilitate selective illumination of the LEDs 46. In one arrangement, as is shown, circuit board 14 is formed of a backing material 48 and a circuitry layer 50.

Backing material 48 is formed of any suitable size, shape and design and serves to provide support to circuitry layer 50 as well as serve heat dissipation purposes. In one arrangement, backing material 48 is formed of a metallic material, such as aluminum, copper, an aluminum alloy, a copper alloy, or any other metallic material, rigid material and/or material the provides for support and/or heat dissipation. In an alternative arrangement backing material 48 is formed of a non-metallic material.

Backing material 48 provides structural support for circuitry layer 50 as well as heat dissipation. That is, when circuitry layer 50 is connected to backing material 48 and backing material 48 is formed of a material with a high coefficient of diffusivity (such as aluminum, an aluminum alloy, copper, a copper alloy, or another alloy material) backing material 48 helps to absorb and diffuse heat generated by LEDs 46. To maximize space utilization within the hollow interior 40 of housing 12, backing material 48 is relatively thick, and substantially thicker than circuitry layer 50, and backing material 48 fits within the hollow interior 40 of housing 12 within relatively close and tight tolerances. In the arrangement shown, when viewed from the side, backing material 48 is generally rectangular in shape with an opposing back wall and forward wall that approximate the size of or are slightly the size of the interior surface of back wall 32 of housing 12 and are positioned in approximate parallel planar spaced relationship with one another; and similarly backing material 48 has a pair of opposing sidewalls that extend a portion of the interior surface of sidewalls 34. The width of backing material 48 is slightly smaller than the width between the interior surfaces of opposing sidewalls 34 of housing 12 so as to facilitate insertion of backing material 48 into the hollow interior 40 of housing 12. The height of backing material 48 is smaller than the height of the interior surfaces of sidewalls 34 so as to provide room for ribbon wire 63 behind backing material 48 as well as to provide room for circuitry layer 50 and LEDs 46 on top of backing material 48. Maximizing the size of backing material 48 within the hollow interior 40 of housing 12, while providing ample room for the other components of the system 10 maximizes heat diffusion and structural rigidity provided by backing material 48.

Circuitry layer 50 is formed of any suitable size shape and design and provides the electrical connection between the electrical components of the system 10. In one arrangement, circuitry layer 50 includes the electrical leads and traces that connect and interconnect the electrical components of system 10 including LEDs 46, ribbon wire 63 and control box 22. Circuitry layer 50 may be formed of multiple layers itself so as to provide electrical isolation between the many electrical leads therein.

While backing material 48 and circuitry layer 50 are described as separate components in one arrangement they may be formed as a single component, or alternatively they may be formed of separate components. That is, circuitry layer 50 may be manufactured separately and then applied to backing material 48. Alternatively, circuitry layer 50 may be formed onto and/or into backing material 48.

Circuit board 14 is formed of any suitable size shape and design and is configured to house, hold and provide the electrical connections for LEDs 46. In the arrangement shown, circuit board 14 includes three rows of densely packed LEDs 46 that extend a length or the entire length between end caps 18 within the hollow interior 40 of housing 12, including a row of amber LEDs 46A, a row of white LEDs 46W and a row of red LEDs 46R. In the arrangement shown, the white LEDs 46 are positioned in the middle with the red and amber LEDs 46 positioned on opposite sides of the row of white LEDs 46, however any other configuration is hereby contemplated for use.

To provide independent control of various portions of light bar system 10, circuit board 14 is electrically separated into a plurality of segments 16. Segments 16 allow for independent control of each segment. In the arrangement shown, light bar 10 is separated approximately down its middle at a seamline 54 into two separate segments 16, such as a driver's side segment 16 and a passenger side segment 16. Segments 16 can be independently illuminated as well as simultaneously illuminated. Separating light bar 10 into driver side and passenger side segments 16 allows the control box 22 to illuminate the entire length of light bar 10 for breaking and backing up, as well as illuminating only one segment 16 for the turning signal. While only two segments 16 are shown, any number of segments 16 are hereby contemplated for use.

To reduce the appearance of the light bar 10 when installed, the exterior facing surface 55 of circuit board 14 is a dark or black color. This dark or black color reduces the visibility of the light bar 10 when installed thereby improving the aesthetic appearance of the light bar 10.

Endcaps & Wiring:

End caps 18 are formed of any suitable size, shape and design and serve to close the hollow interior 40 of housing 12 at its outward ends. In one arrangement, one end cap 18 allows the passage of wiring 56 there through whereas the opposite end cap 18 does not have wiring 56 passing there through and as such this end cap 18 simply closes the opposite end of housing 12 from the wiring end cap 18. To continue with the low-profile appearance theme of the light bar 10, in one arrangement, end caps 18 are formed of a black material, like the back portion or non-transparent portion 44 of housing 12. End caps 18 are friction fit as well as sealed within the hollow interior 40 of housing 12 so as to prevent water and contaminants from entering hollow interior 40. End caps 18 are sealed into housing 12 by any manner, method or means such as gluing, adhering, welding, heat shrinking, taping, wrapping and/or any combination thereof or the like.

Wiring 56 is made up of an electrically conductive material such as a metal or alloy. Non-limiting examples of electrically conductive materials include, gold, gold alloys, copper, copper alloys, silver, silver alloys, nickel, nickel alloys, palladium, palladium alloys, zinc, and zinc alloys may be used. In at least one embodiment, the use of a gold alloy for wiring 56 is preferred.

Wiring 56 exiting one end of housing 12 electrically connects to control box 22 and includes a fuse 58 before electrically connecting to a plug 60. Plug 60 is formed of any suitable size, shape and design and in one arrangement is formed of a conventional four-way trailer plug that electrically connects to the electrical system of many standard vehicles 30. However any other form of plug is hereby contemplated for use as is directly wiring the wiring 56 of light bar 10 into the wiring system of vehicle 30.

In one arrangement, wiring 56 also includes one or more signal leads 62. Signal lead 62 is an electrical lead that is configured to be electrically connected to electrical system of vehicle 30, and more specifically a reverse light lead, a left turn signal lead, a right turn signal lead or another electrical lead of vehicle 30. In combination, plug 60 and signal lead(s) 62 are configured to receive power and operational signals from vehicle 30 and provide operational signals to light bar 10. That is, as a user operates vehicle 30, the lights in the back of the vehicle 30, where light bar 10 is positioned, are controlled in various ways. That is, when the user presses the brake pedal, the brake lights of the light bar 10 illuminate until the brake pedal is released; when the user engages a turn signal, the appropriate turn signal of the light bar 10 periodically flashes until the turn signal is disengaged; when the user places the vehicle 30 in reverse, the reverse lights of the light bar 10 illuminate until the vehicle 30 is removed from reverse; when the user turns the hazard lights on, the brake lights of the light bar 10 flash until the hazard lights are turned off, and so on. Signal lead 62, as well as the other wires of wiring 56, are configured to receive and transmit the operational signals to the light bar 10 so that light bar 10 can illuminate appropriately and in coordination with the lights of vehicle 30.

In the arrangement wherein the light bar 10 is formed of two segments 16, a ribbon wire 63 extends outward from an end of each segment 16. That is, a ribbon wire 63 connects to the first segment 16 and extends outward through the end cap 18 that allows passage of the ribbon wire 63 there through. A second ribbon wire 63 extends under the circuit board 14 of the first and second segment 16 and electrically connects to the end of second segment 16 opposite first segment 16. This ribbon wire 63 also extends out the same end cap 18 such that both wires extend out of the same end of housing 12. In the arrangement shown, ribbon wire 63 includes six wires, or three pairs of wires, one pair for each color of LED 46 (white LED 46W, red LED 46R, and amber LED 46A). As depth of the system 10 is important to maintain the low profile nature of the system 10, to minimize the depth of the system, only two segments 16 are used and therefore only one layer of ribbon wire 63 extends below the segments 16. Having the ribbon wire 63 extend out of the outward ends of the segments 16 allows the circuit boards 14 and backing material 48 and circuitry layer 50 connect to one another in flush alignment with one another at seamline 54 in flush and flat engagement with little to no gap there between. This allows for practically seamless illumination between opposing segments 16 and makes it practically impossible to distinguish between the opposing segments 16 as the spacing of the LEDs 46 is maintained across the seamline 54. That is, the seamline 16 does not disturb the continuous spacing of LEDs 46 from one segment 16 to the other segment 16. In fact, the seamline 54 is itself hard to see when light bar 10 is inspected.

Control Box:

System 10 includes a control box 22. Control box 22 is formed of any suitable size, shape and design and is configured to receive operational signals from the electrical system of vehicle 30, interpret these signals and output operational signals that control operation of light bar 10. Control box 22 includes a microprocessor 64 and memory 66 among other components. Microprocessor 64 is any device which receives informational signals, interprets these signals, and outputs information or commands based on instructions stored in memory 66. Memory 66 is any form of an informational storage device or system, such as RAM, flash memory, a hard drive, or the like. Information or instructions in the form of software, code, firmware or the like are stored on memory 66 and is accessible to microprocessor 64. Microprocessor 64 and memory 66 may be formed of a single unitary device, separate but electrically connected devices, or a plurality of separate but electrically connected devices.

Since light bar 10 is configured to be installed on practically any vehicle 30, microprocessor 64 and memory 66 are programmed to interpret signals from multiple types of vehicles and output the appropriate operational signals. That is, in one arrangement, microprocessor 64 and memory 66 are programmed to detect or determine what type of vehicle they are connected to and then determine the appropriate operational signal to output based on what operational signals are received as input. In this way, the use of control box 22 and microprocessor 64 and memory 66 allows for seamless utilization of a single light bar 10 for multiple makes and models of vehicle 30 without the need to program or reprogram the microprocessor 64 and memory 66 for each vehicle 30. This increases the speed and ease of installation and use.

Figure 9A:
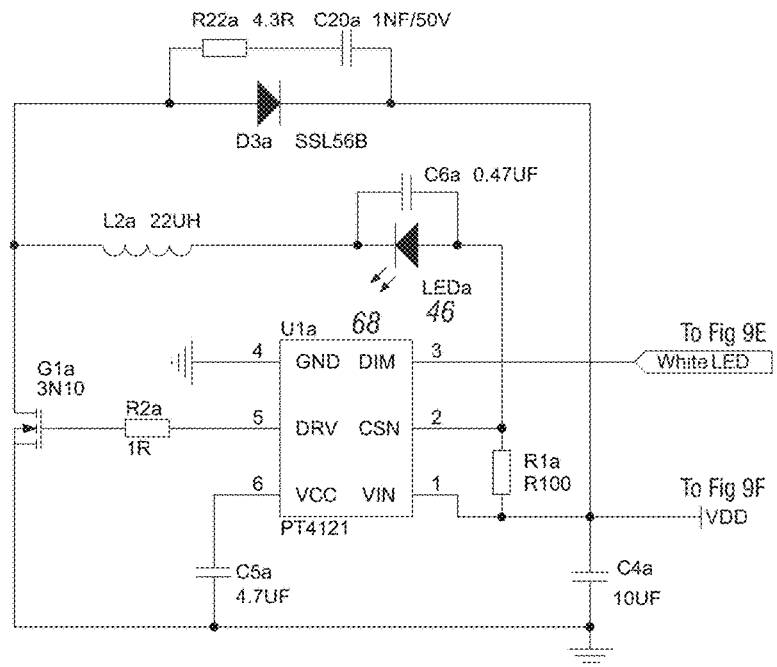
FIGS. 9A-G show detailed electrical schematic views of the light bar system of FIG. 2, the views showing the exemplary electrical components and logic used for automatically overriding the continuous interpretation of signals directly received from the electrical system of the vehicle with a manual instruction and resulting pattern caused by illuminating the LEDs at specific times.
Figure 9B:
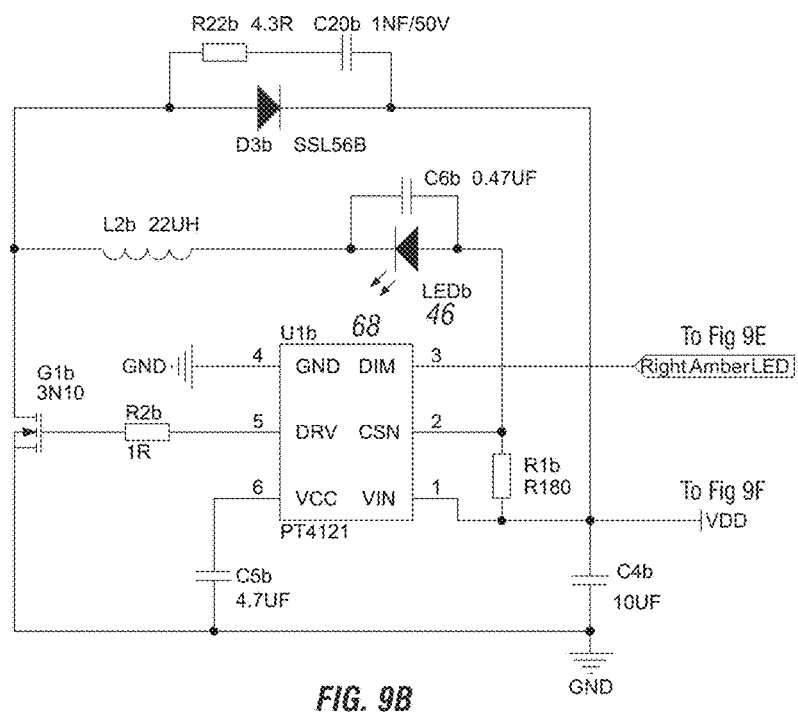
Figure 9C:
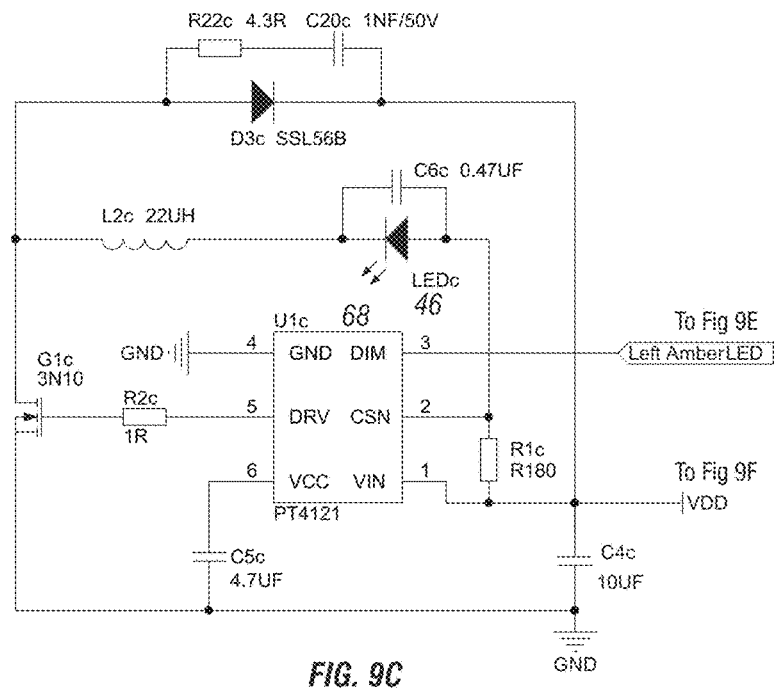
Figure 9D:
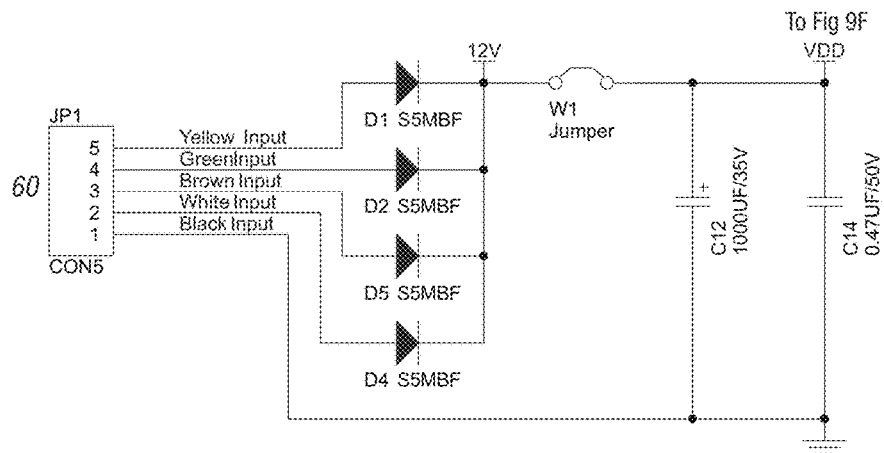
Figure 9E:
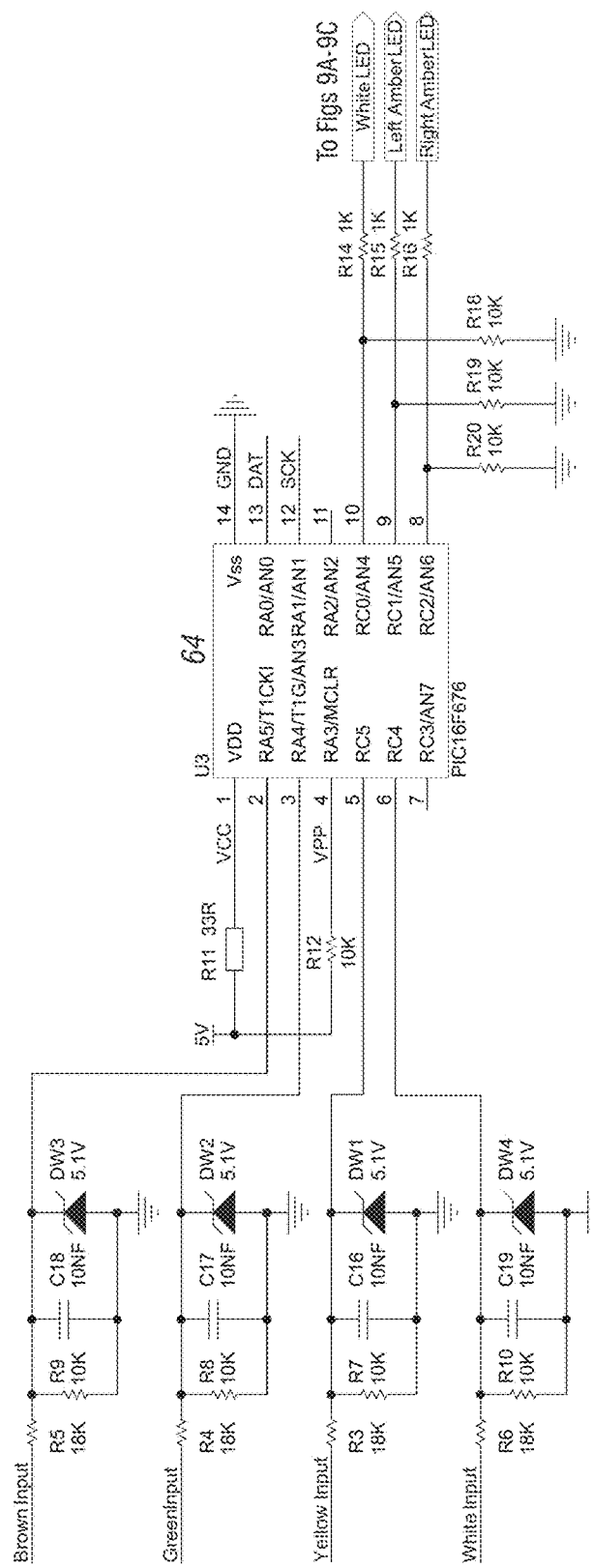

The microprocessor 64 shown in FIG. 9E may also be programmed to override the automatic interpretation of signals and illumination of the independently controllable segments of the vehicle light bar in the event a manual instruction is sent by an operator with a strobing pattern. The microprocessor 64 for example may be a PIC16F676. In some embodiments, the microprocessor 64 may be a 14 pin, flash-based 8-bit CMOS microcontroller and may include a high-performance reduced instruction set computer (RISC) CPU. The RISC CPU has only 35 instructions to learn, all of which are single-cycle except branches; an operating speed associated with a 20 MHz oscillator/clock input and a 200 ns instruction cycle; an interrupt capability; an 8-level deep hardware stack; a direct, indirect, and relative addressing modes. The microprocessor 64 features internal and external oscillator options, with a precision internal 4 MHz oscillator factory calibrated to +/−1%, an external oscillator support for crystals and resonators, and a 5 µs wake-up from sleep, 3.0V, typical; a power-saving sleep mode; a wide operating voltage range—2.0V to 5.5V; an industrial and extended temperature range; a low-power power-on reset (POR); a power-up timer (PWRT) and oscillator start-up timer (OST); a brown-out detect (BOD); a watchdog timer (WDT) with independent oscillator for reliable operation; a multiplexed MCLR/input-pin; an interrupt-on-pin change; an individual programmable weak pull-ups; and a programmable code protection; a high endurance flash/EEPROM cell with a 100,000 write flash endurance, a 1,000,000 write EEPROM endurance, and a flash/data EEPROM retention greater than 40 years. The microprocessor 64 may have several low-power features including a standby current of 1 nA at 2.0V, typical; an operating current of 8.5 µA at 32 kHz, 2.0V, typical or 100 µA at 1 mHz, 2.0V, typical; a watchdog timer current of 300 nA at 2.0V, typical; and a timer 1 oscillator current of 4 µA at 32 kHz, 2.0V, typical. The microprocessor 64 may also peripherally feature 12 I/O pins with individual direction control, high current sink/source for direct LED drive, an analog comparator module with one analog comparator, a programmable on-chip comparator voltage reference (CVREF) module, a programmable input multiplexing from device inputs, and a comparator output that is externally accessible; an analog-to-digital converter module with a 10-bit resolution, a programmable 8-channel input, and a voltage reference input; an enhanced timer with a 16-bit timer/counter with a prescaler, an external gate input mode, and an option to use OSC1 and OSC2 in LP mode as a timer oscillator, if INTOSC mode is selected; and in-circuit serial programming via two pins.

Figure 11:
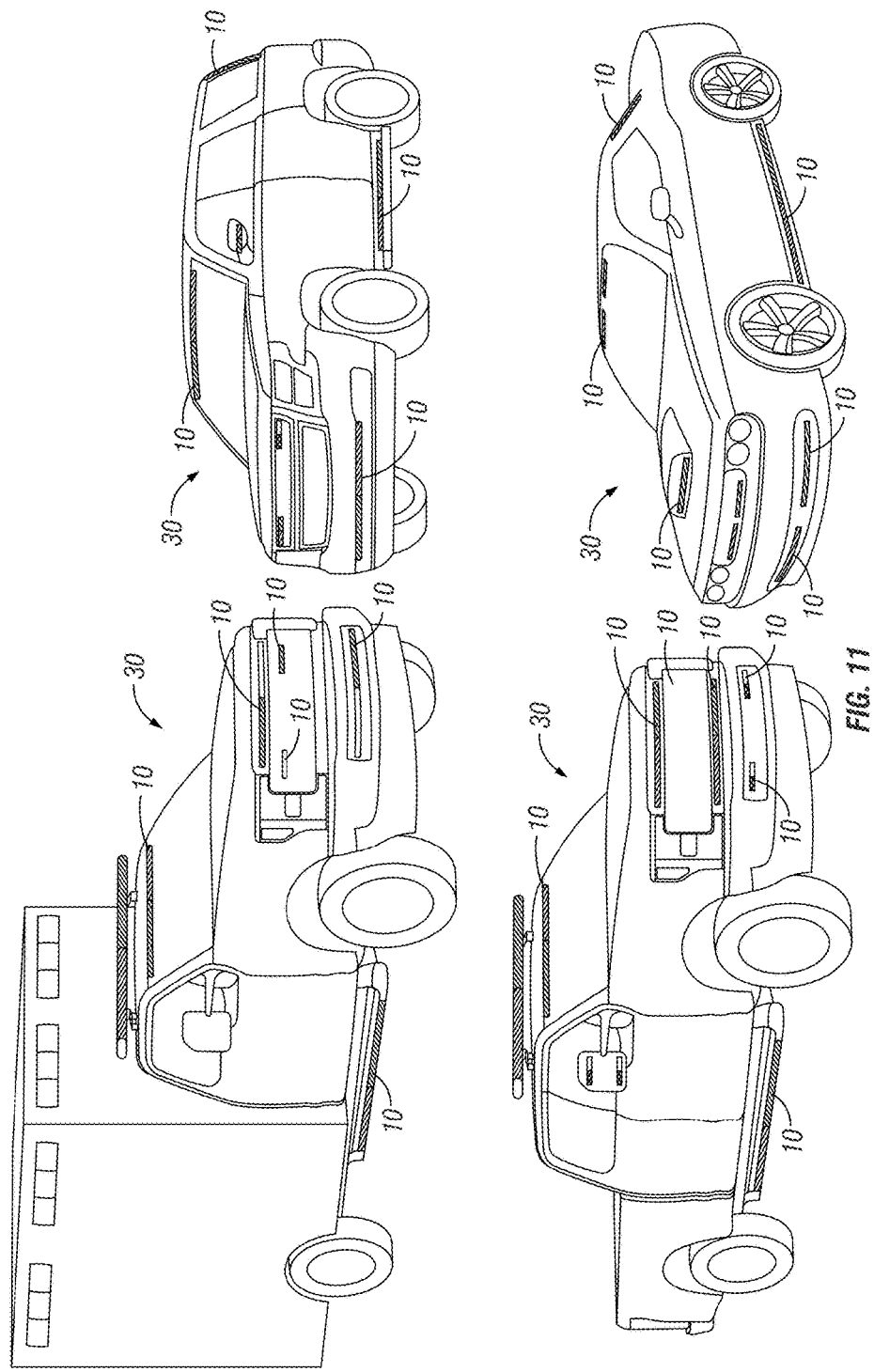
FIG. 11 shows exemplary vehicles which may have use for an emergency light bar, including a police car, a security vehicle, a fire truck, and an ambulance.
Figure 12:
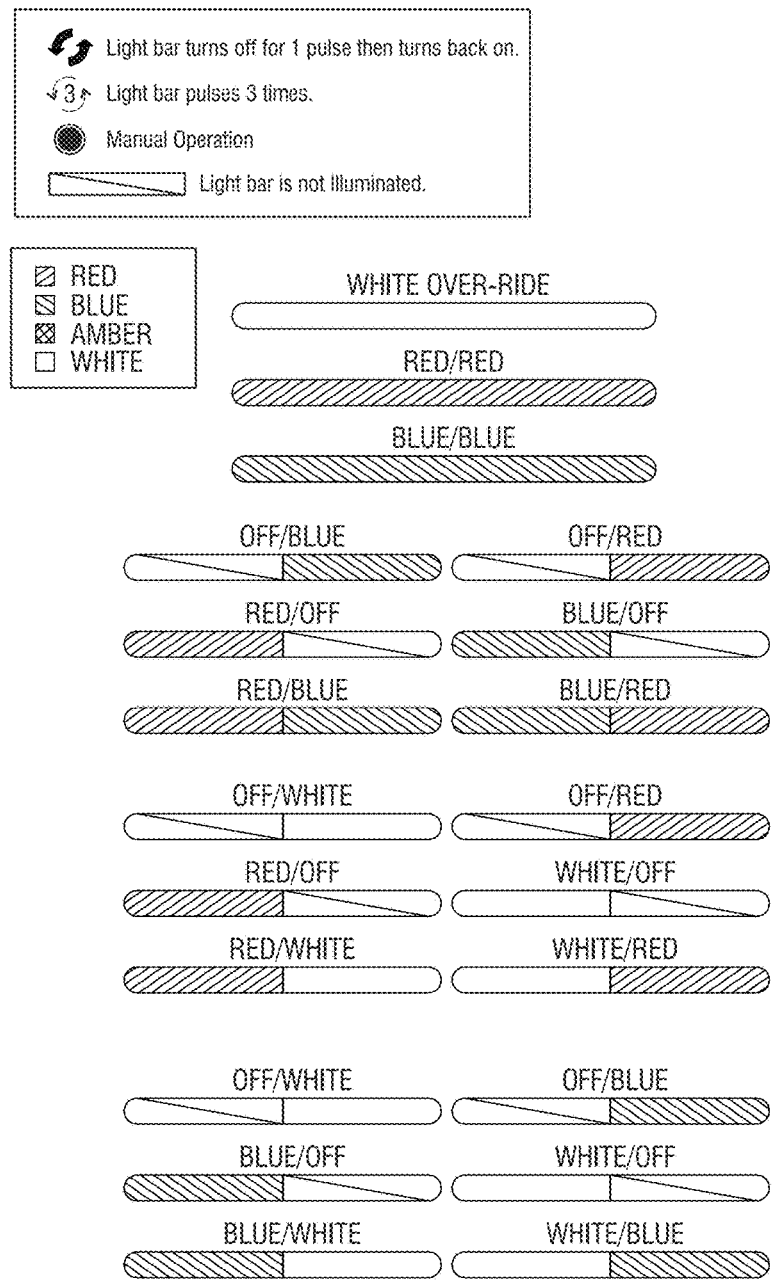
FIG. 12 shows possible color combinations and strobing patterns associated with an emergency light bar.
Figure 13:
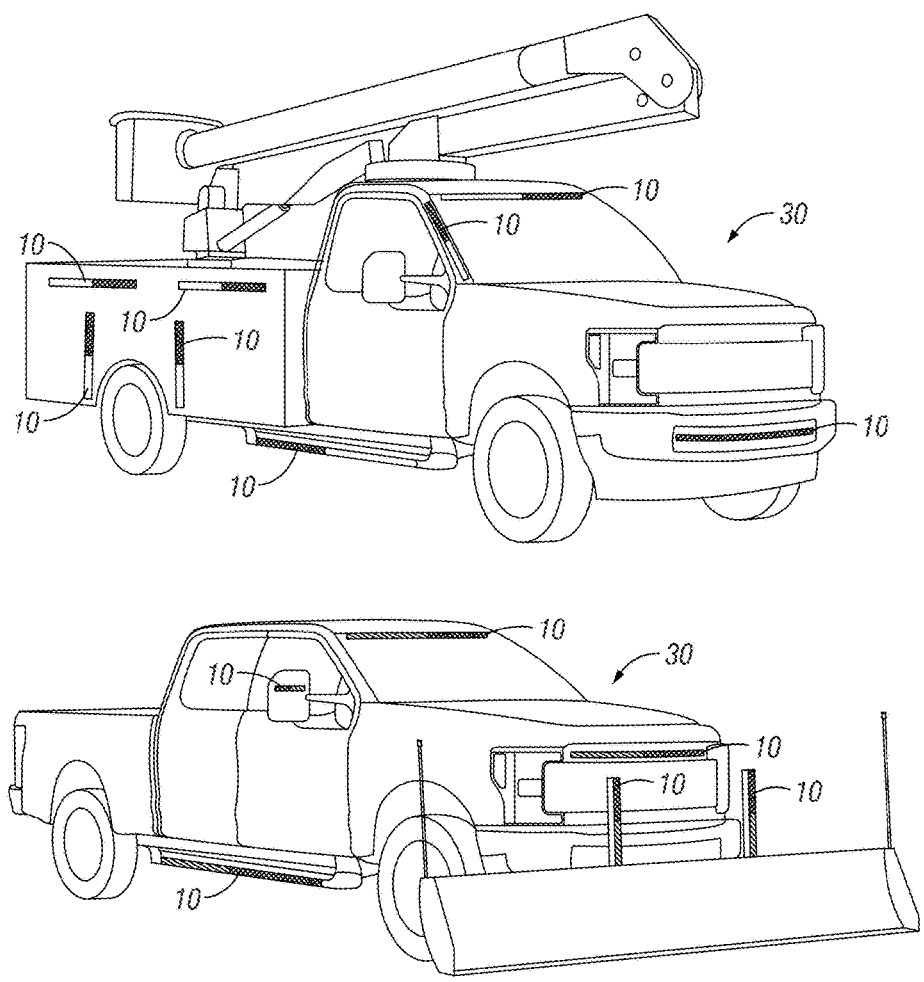
FIG. 13 shows exemplary vehicles which may have use for an emergency light bar, including a pickup truck and a construction vehicle including a boom.
Figure 14:
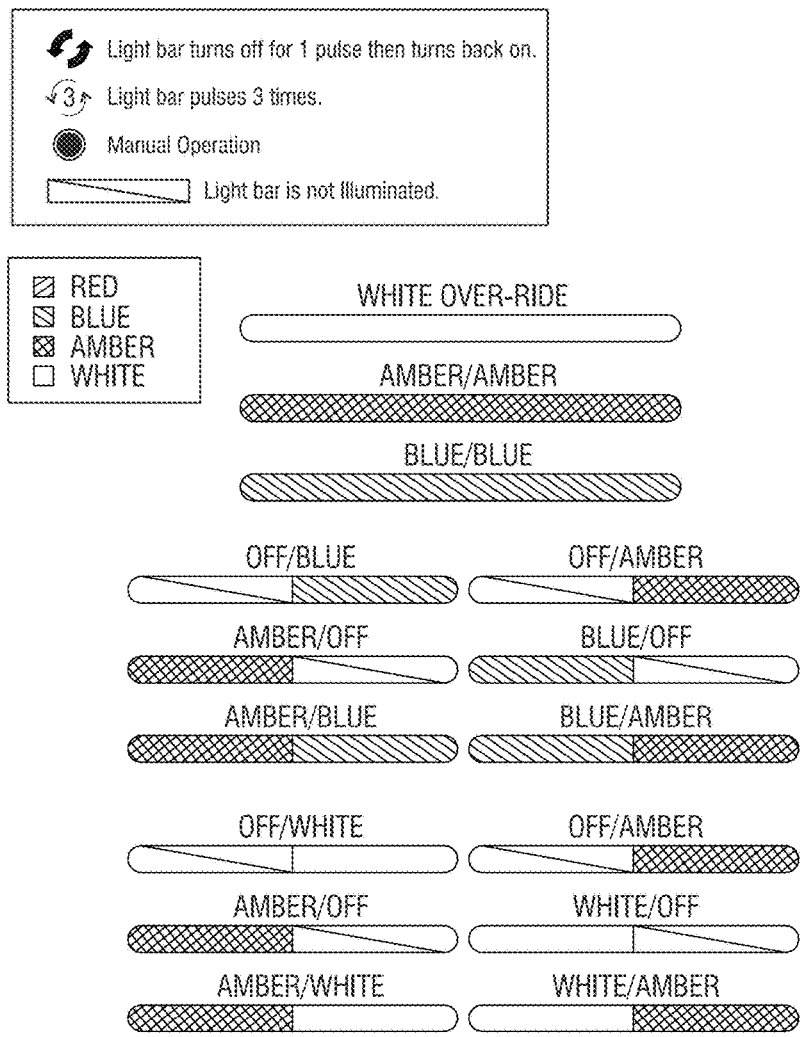
FIG. 14 shows possible color combinations and strobing patterns associated with a work light bar.

The strobing pattern may be selected from the group consisting of an emergency strobing pattern and a work light strobing pattern, as shown in FIGS. 12 and 14. The strobing patterns may be employed on light bars 10 utilized with the exemplary vehicles shown in FIGS. 10 and 11.

For an emergency light bar, the light bar 10 may be segmented into two independently controllable light segments that have red, white, and blue LEDs. The light bar 10 may achieve any of the possible color combinations shown in FIG. 12. For example, the left independently controllable light bar segment may be red and the right independently controllable light bar segment may be blue, the left independently controllable light bar segment may be white and the right independently controllable light bar segment may be off, or any other combination of red, blue, white, and off.

For a work or construction light bar, the light bar 10 may be segmented into two independently controllable light segments that have amber, white, and blue LEDs. The light be 10 may achieve any of the possible color combinations shown in FIG. 14. For example, the left independently controllable light bar segment may be amber and the right independently controllable light bar segment may be blue, the left independently controllable light bar segment may be white and the right independently controllable light bar segment may be off, or any other combination of amber, blue, white, and off.

Other color combinations and purposes for using the light bar 10 not expressly disclosed herein are still contemplated by the present invention. Other examples of non-limiting colors of LEDs could include green, purple, yellow, silver, etc. and other non-limiting examples of purposes could include customizing the look of vehicles, administering funerals, etc.

Figure 10:
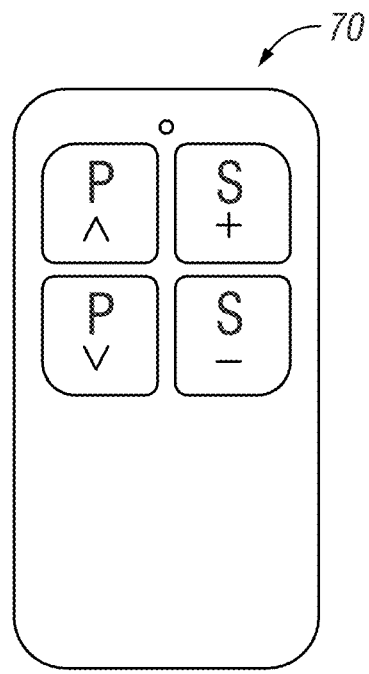
FIG. 10 shows an elevation view of a wireless remote capable of sending a manual instruction or signal which corresponds with a specific lighting pattern for the light bar shown in FIG. 2.

The lights in FIGS. 11-14 may strobe by turning off for one pulse and then turning back on; by pulsing in triplets; or by an operator manually pulsing the lights, potentially via the use of a remote control, such as the remote control in FIG. 10. Such a remote control may be wireless and may allow an operator to manually choose the timing, color, and brightness of a pulse by sending an instruction to the microprocessor 64 to perform a specific strobing pattern. The manual instruction may also be created by switches, buttons, or dials that are directly or operationally attached to the control box 22. Still in other embodiments, the manual instruction could be controlled by depressing the pedals, using turn signals, etc. In other words, the manual instruction could be used to override the normal operational lights of the vehicle or the normal operational lights of the vehicle could override a specific strobing pattern, such as an emergency or work light strobing pattern. The different pulsing and color combinations result in at least sixty-four separate strobe operations in addition to a completely white override and the ability to manually pulse the lights.

Electrical Components of the Control Box and the Circuit Board:

As shown in FIGS. 9A-9C, the portion of the circuit board 14 and control box 22 associated with each individual LED 46 (e.g., a white LED in FIG. 9A, a right amber LED in FIG. 9B, and a left amber LED in FIG. 9C) include any necessary logic and electrical components for automatically receiving signals from the electrical system of the vehicle, interpreting the signals received from the electrical system of the vehicle, and in response automatically controlling illumination of independently controllable segments of the vehicle light bar.

For example, the electrical components and logic within the system may be provided and preferably arranged according to the views presented. The system uses several resistors to reduce current flow, adjust signal levels, to divide voltages, bias active elements, and terminate transmission lines, among other things; several capacitors to store energy, to smooth the output of the power supply, and for blocking direct current while allowing alternating current to pass; several inductors for block alternating current while allowing direct current to pass and for separating signals of different frequencies; and several diodes for allowing an electric current to pass in one direction and to convert alternating current to direct current.

Of particular importance in FIGS. 9A-9C is the placement of the LEDs 46 and the high-efficiency step-down controller 68. The high-efficiency step-down controller 68 is designed to operate in continuous conduction mode and drive single or multiple series connected LEDs 46 efficiently from a voltage source higher than the total LED chain voltage. For example, the high-efficiency step-down controller 68 may be a PT4121 may provide an externally adjustable output current. In some embodiments, the high-efficiency step-down controller 68 includes a high-side output current sense circuit, which uses an external resistor to set the nominal average output current, and a dedicated DIM input accepts either a DC voltage or PWM dimming. The high-efficiency step-down controller 68 features a simple low parts count, a high efficiency up to 97%, single pin on/off and brightness control using DC voltage or PWM, up to 1 MHz switching frequency, adjustable constant LED current, typical 3% output current accuracy, a high-side current sense, a hysteretic control, an inherent $R_{CS}$ open protection, an inherent open-circuit LED protection, an inherent short-circuit LED protection, and a thermal shutdown. The high-efficiency step-down controller 68 may be used in low voltage halogen replacement LEDs, automotive or decorative lighting, low voltage industrial lighting, as LED backup lighting, as signs/emergency lighting, etc. The recommended operating range for the high-efficiency step-down controller 68 includes temperatures ranging from negative forty degrees Celsius to eighty-five degrees Celsius and a supply wide input voltage from 6V to 60V. Exceeding these ranges may damage the device or cause the device to cease functioning. When the device operates at high ambient temperature, or when driving maximum load current, care must be taken to avoid exceeding the package power dissipation limits.

In some embodiments, the high-efficiency step-down controller 68, in conjunction with a current sense resistor ($R_{CS}$), an inductor ($L_1$), and a MOSFET, forms a self-oscillating continuous-mode buck converter. When the input voltage (VIN) is first applied, the initial current in the inductor and the current sense resistor is zero and there is no output from the current sense circuit. Under this condition, the output of a current sensing comparator is high. This turns on switch, causing current to flow from the input voltage to ground, via the current sense resistor, the LEDs 46, the inductor, and the external MOSFET. The current rises at a rate determined by the input voltage and the inductor to produce a voltage ramp (VSCN) across the current sense resistor. When the difference between the input voltage and the voltage ramp is greater than 230 mV, the output of the current sensing comparator switches low and the switch turns off. The current flowing on the current sense resistor decreases at another rate. When the difference between the input voltage and the voltage ramp is less than 170 mV, the switch turns on again and the mean current on the LED 46 is determined by 200 mV per each current sense resistor. The high-side current-sensing scheme and on-board current-setting circuitry minimize the number of external components while delivering LED current with ±3% accuracy, using a 1% sense resistor. The high-efficiency step-down controller 68 allows dimming with a PWM signal at the DIM input. A logic level below 0.3V at DIM forces the high-efficiency step-down controller 68 to turn off the LED 46 and the logic level at DIM must be at least 2.5V to turn on the full LED current. The frequency of PWM dimming ranges from 100 Hz to 20 kHz. The DIM pin can be driven by an external DC voltage ($V_{DIM}$) to adjust the output current to a value below the nominal average value defined by the current sense resistor. The DC voltage is valid from 0.5V to 2.5V. When the DC voltage is higher than 2.5V, the output current keeps constant. Additionally, to ensure the reliability, the high-efficiency step-down controller 68 is built with a thermal shutdown (TSD) protection. The thermal shutdown protects the integrated circuit from over temperature (above one hundred-fifty degrees Celsius).

As shown in FIGS. 9A-9C, the high-efficiency step-down controller 68 as shown includes the following pins: 1 VIN, an input power supply pin connected to a decoupling capacitor from VIN pin the ground; 2 CSN, an LED current sense input connected to a current-sense resistor that programs LED average current to the VIN pin; 3 DIM, a logic level dimming input driving the DIM pin low to turn off the current regulator and driving the DIM pin high to enable the current regulator; 4 GND, the signal and power ground connected directly to a ground plane; 5 DRV, a gate-driver output connected to the gate of the external MOSFET; and 6 VCC, an internal regulator output connected to a 1 µF decoupling cap from the VCC pin to the ground. In still other embodiments (not shown), the high-efficiency step-down controller 68 may include two or more pins that are not initially connected to anything for further versatility.

The nominal average output current in the LEDs 46 is determined by the value of the external current sense resistor connected between VIN and CSN and is given by $I_{OUT}/R_{CS}$. This equation is valid when DIM pin is float or applied with a voltage higher than 2.5V (must be less than 5V). Actually, the current sense resistor sets the maximum average current which can be adjusted to a less one by dimming.

The DIM pin can be driven by an external DC voltage ($V_{DIM}$), to adjust the output current to a value below the nominal average value defined by the current sense resistor. The average output current is given by $$I_{OUT} = \frac{0.2 \times V_{DIM}}{2.5 \times R_{CS}} (0.5 \text{ V} \le V_{DIM} \le 2.5 \text{ V}).$$

100% brightness corresponds to $2.5V \le V_{DIM} \le 5V$.

A pulse with modulated (PWM) signal with duty cycle PWM can be applied to the DIM pin, to adjust the output current to a value below the nominal average value set by the current sense resistor. PWM dimming provides reduced brightness by modulating the LEDs 46 forward current between 0% and 100%. The LED brightness is controlled by adjusting the relative ratios of the on time to the off time. A 25% brightness level is achieved by turning the LED on at full current for 25% of one cycle. To ensure this switching process between on and off state is invisible by human eyes, the switching frequency must be greater than 100 Hz, the human eyes average the on and off times, seeing only an effective brightness that is proportional to the LEDs on-time duty cycle. The advantage PWM dimming is that the forward current is always constant, therefore the LED color does not vary with brightness as it does with analog dimming. Pulsing the current provides precise brightness control while preserving the color purity the dimming frequency of the high-efficiency step-down controller 68 can be as high as 20 kHz.

An external capacitor from the DIM pin to ground will provide additional soft-start delay, by increasing the time taken or the voltage on this pin to rise to the turn-on threshold and by slowing down the rate of rise of the control voltage at the input of the comparator.

A low equivalent series resistance (ESR) capacitor should be used for input decoupling, as the ESR of this capacitor appears in series with the supply source impedance and lowers overall efficiency. This capacitor has to supply the relatively high peak current to the coil and smooth the current ripple on the input supply. A minimum value of 10 µF is acceptable if the DC input source is close to the device, but higher values will improve performance at lower input voltages, especially when the source impedance is high. The voltage rating should be greater than the input voltage. The input capacitor should be placed as close as possible to the integrated circuit. For maximum stability over temperature and voltage, capacitors with X7R, X5R, or better dielectric are recommended. Capacitors with &5V dielectric are not suitable for decoupling in this application and should not be used.

Lower value of inductance can result in a higher switching frequency, which causes a larger switching loss. Choose a switch frequency between 100 kHz to 500 kHz for most applications. According to switching frequency, inductor value can be estimated as:

$$L = \frac{\left(1 - \frac{V_{OUT}}{V_{IN}}\right) \times V_{OUT}}{0.3 \times I_{LED} \times fsw}$$

For higher efficiency, choose an inductor with a DC resistance as small as possible.

For most applications, the output capacitor is not necessary. Peak to peak ripple current in the LEDs 46 can be reduced below 30% of the average current, if required, by adding a capacitor across the LEDs 46. A value of 2.2 µF will meet most requirements. Proportionally lower ripple can be achieved with higher capacitor values. Note that the capacitor will not affect operating frequency or efficiency, but it will increase start-up delay and reduce the frequency of dimming, by reducing the rate of rise of LED voltage.

The current sense resistor should be placed close to the VIN pin and CSN pin in order to minimize current sense error. The input loop including input capacitor, Schottky diode, and MOSFET which should be as short as possible.

Clip:

Clip 28 is formed of any suitable size, shape and design and is configured to connect housing 12 to vehicle 30. In one arrangement, as is shown, clip 28 has a back wall 100 that extends between opposing end walls 102 and opposing sidewalls 104. Back wall 100 has a generally flat forward face 106 and a generally flat rearward face 108 that form planes that extend in approximate parallel spaced relation to one another. Opposing sidewalls 104 extend in approximate parallel spaced relation to one another and opposing end walls 102 extend in approximate parallel spaced relation to one another. As such, sidewalls 104 and end walls 102 extend in approximate perpendicular alignment to one another thereby forming a generally rectangular member.

A pair of opposing arms 110 are connected to each end of clip 28. Arms 110 are connected to sidewalls 104 and extend upward a distance from forward face 106. The outward edge of arm 110 is in planar alignment with sidewall 104. The outward end of arm 110 is in alignment with end wall 102 and extends inward a distance therefrom. Arms 110 include a locking feature 112 positioned at their outward most end. Locking features 112 are formed of any suitable size, shape and design and are designed to engage and lock housing 12 into clip 28. In one arrangement, locking features 112 are formed of a step or ledge or hook that matingly engage the feature 38 or step in the exterior surface of housing 12 positioned at the intersection of cover portion 36 and sidewalls 34. In the arrangement shown, when clip 28 is viewed from the and end 102, locking features 112 on opposing arms 110 extend inward and over the forward face of back wall 100 a distance. Accordingly, to facilitate locking engagement, arms 110 extend upward from forward face 106 approximately the same distance as sidewall 34 of housing 12.

To further facilitate a firm, durable and strong connection between clip 28 and housing 12, arms 110 are slightly biased inward toward one another. This causes the distance between the outward ends of arms 110 to be slightly narrower than the width of housing 12. As such, when housing 12 is placed between opposing arms 110 and locked into place an inward force is applied on housing 12 by arms 110. This helps to hold housing 12 within clip 28. This also helps to keep engagement between locking feature 112 of arm 110 and the feature 38 of housing 12.

Due to the slight inward bias of the arms 110 of clip 28, the outward most ends of arms 110 include a curved or angled guiding surface 114. Guiding surface 114 helps to guide the housing 12 into the space between opposing arms 110. In the arrangement shown, guiding surface 114 curves or angles inward from the upper most end of arms 110 down to the step of locking feature 112. This causes the upper ends of guiding surface 114 to be wider than the width of back wall 32 of housing 12, while the lower end of guiding surface 114 is narrower than the width of back wall 32 of housing 12. This causes the arms 110 to flex or bend outward as the light bar 10 is forced within the clip 28.

The rearward face 108 of back wall 100 is flat and thereby provides maximum surface area for connection to the body of vehicle 30. This allows for the use of an adhesive, such as a double sided tape or foam or gel to be positioned between the rearward face 108 of clip 28 and the body of vehicle 30. Using adhesive eliminates the need to put screws or bolts into the body of vehicle 30, simplifies the installation process, speeds the installation process, eliminates the need to use tools to install the clips 28 and provides a durable installation.

Despite that the installation process that uses adhesives instead of drilling and screwing, back wall 100 includes an opening 116 therein that facilitates reception of a screw or other fastening device therein if the installer chooses to use a fastener. In one arrangement, to ensure the head of the screw does not protrude, the opening 116 is countersunk. That is, the walls of the opening angle inward as they extend from forward face 106 to rearward face 108.

Installation and Use:

The system 10 is installed by first placing adhesive on the rearward face 108 of a plurality of clips 28. In one arrangement, the clips 28 are then adhered to the body of vehicle 30. Once the clips 28 are installed on the vehicle 30, the housing 12 is aligned with the clips 28 and the housing 12 is forced into the clips 28. Alternatively, the clips 28 are installed onto the housing 12 and then the housing 12 and clips 28 are simultaneously installed onto the body of the vehicle 30.

When the housing 12 is forced into the clips 28, the back wall 32 of housing 12 engages the upper or outward end of the guiding surface 114 of arms 110 of clips 28. As the guiding surfaces 114 angle inward and because the arms 110 are angled slightly inward, force is applied causing the arms 110 to elastically bend outward as the housing 12 is forced downward between opposing arms 110. The arms 110 continue to bend outward until the ledge or step of features 112 of clip 28 passes or engages the step or features 38 of housing 12. At this point the locking features 112 of arms 110 engage or lock onto the step or features 38 of housing 12 thereby locking the housing 12 within the clip 28 with a strong and durable connection. In this position, the flat back wall 32 of housing 12 is in flat and flush engagement with the forward face 106 of the flat back wall 100 of clip 28. In this position, the exterior surface of sidewalls 34 of housing 12 are in flat and flush engagement with the interior faces of arms 110 of clip 28. In this position, the lower surface of features 112 in the end of arms 110 are in flat and flush locking engagement with the upper surface of the features 38 of the housing 12.

Figure 2:
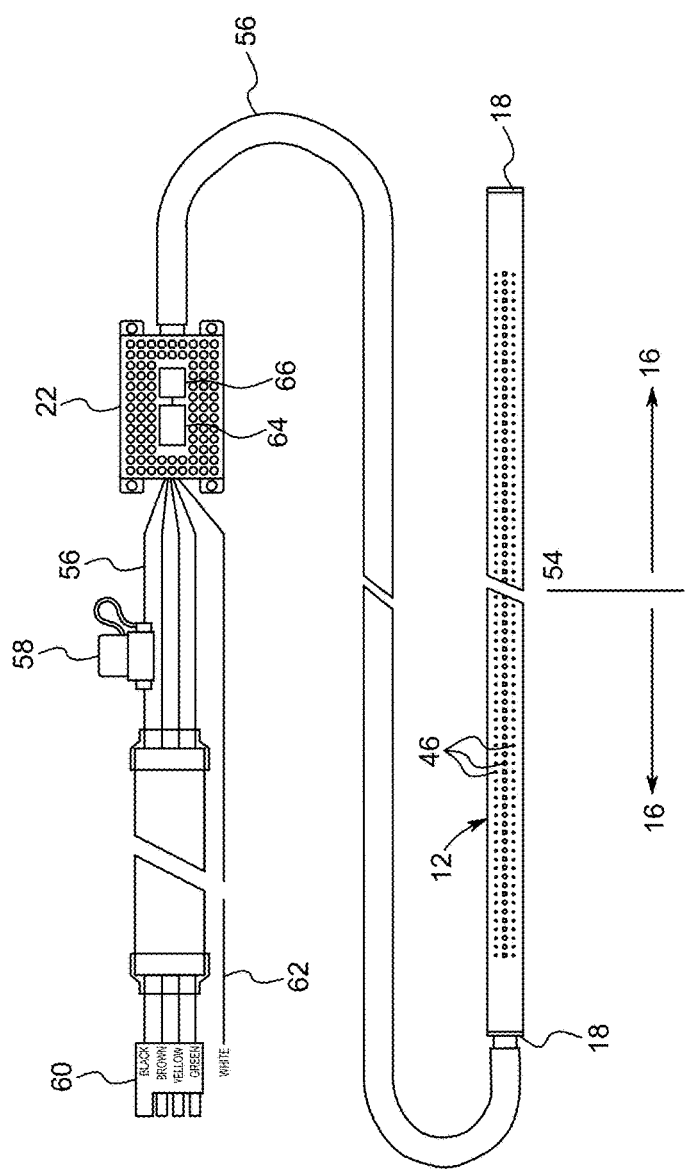
FIG. 2 is an elevation schematic view of the light bar system, the view showing the light bar having three rows of LEDs, the view showing the wiring system connected to the light bar, the view showing the control box connected to the wiring system, the view showing the fuse and plug, and electrical leads connected to the light bar that are configured to connect to the electrical system of the vehicle to which the light bar is attached.
Figure 9F:
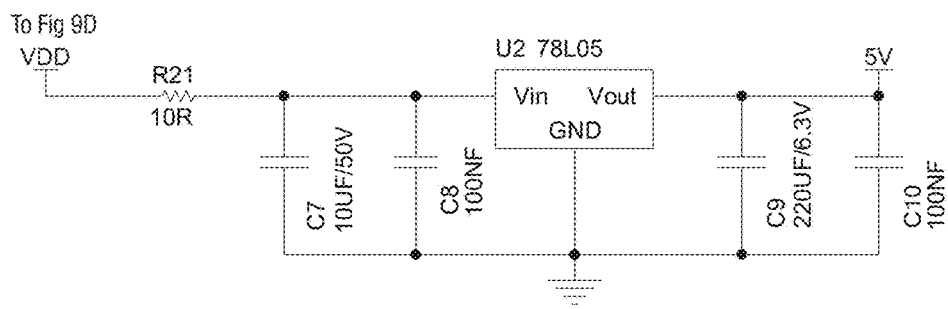
Figure 9G:
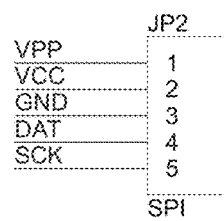

Once the housing 12 is installed, the plug 60 and signal lead 62 are connected to the electrical system of the vehicle 30, as shown in FIGS. 2 and 9D-E. Once electrically connected, the control box 22 and microprocessor 64 and memory 66 receive power and operational signals from the electrical system of the vehicle 30. Power may be delivered from the electrical system via the power supply shown in FIG. 9F. The microprocessor 64 interprets these signals according to the instructions stored in memory 66 and outputs operational signals that control operation of the light bar 10.

Dimensions:

In one arrangement, to ensure that the system 10 fits practically every commercially available pickup truck, in one arrangement, the light bar system 10 comes in two lengths, 60 inches or 48 inches. The use of these two lengths facilitates use on practically all commercially available pickup trucks. Any other length is hereby contemplated for use. The light bar has a depth approximately ⅜ of an inch without the clip 28 and approximately ½ of an inch with the clip 28 installed. The light bar 10 has a height of approximately ⅝ of an inch without the clip 28 and ¾ of an inch with the clip 28 installed. In one arrangement, the clips 28 are approximately 3 and ¼ inches long. Any other depth and/or width is hereby contemplated for use.

Method of Manufacture:

In one arrangement, the system 10 is manufactured in the following manner.

The housing 12 is extruded of a clear plastic material and the back wall 32 and the rear portions of the sidewalls 34 (nontransparent portion 44) are painted with a dark or black color. Alternatively, the housing 12 is extruded and the nontransparent portion 44 is extruded of a nontransparent material whereas the transparent portion 42 is extruded of a transparent material.

Next, the circuit board 14 is formed in segments 16. This is accomplished by installing the LEDs 46 onto the circuitry layer 50 and then installing the LEDs 46 and circuitry layer 50 on the backing material 48. Once the LEDs 46 are installed onto the circuit board 14 a first layer 120 of encapsulant 20 is laid over the LEDs 46 and the exterior facing surface 55 of circuit board 14.

Encapsulant 20 is formed of any flowable material that seals the LEDs 46 and circuit board 14. In one arrangement, encapsulant 20 is a flowable material when initially applied that later cures to a non-flowable material. In one arrangement, encapsulant 20 is a flowable plastic material that is transparent or translucent. In one arrangement, while the encapsulant 20 is initially flowable, it hardens to a rigid, semi-rigid, flexible or rubber-like material.

Next, the separate segments 16 are connected together by aligning the adjacent segments 16 in end-to-end engagement thereby forming seamline 54 there between and then an adhesive is laid over the rearward face of the circuit board 14, such as a glue, paste, tape, double sided tape or the like. This using an adhesive such as a double sided tape, gel or the like holds the two segments 16 together while also provides for adhesion of ribbon wire 63 to the back of circuit board 14 as well.

Since both segments 16 have ribbon wire 63 extending outward from an end of the segment 16, and it is desirable to have wires only coming out one end of the housing 12, the ribbon wire 63 of one segment 16 is folded around and onto the back of circuit board 14 such that both ribbon wires 63 extend out of the same end of system 10. In this position, the adhesive holds the folded ribbon wire 63 in place on the back of circuit board 14.

Now that both ribbon wires 63 extend outward from the same end of circuit board 14, the combined and assembled circuit board 14 formed of both segments 16 is slid into the hollow interior 40 of housing 12 through an open end of the housing 12 until the assembled circuit board 14 is fully installed within the hollow interior 40 of housing 12.

Once fully installed, an end cap 18 is positioned over each end. Once installed, the end caps 18 are sealed in place.

Next, to fully encapsulate the housing 12, the housing 12 is vertically aligned, so as to help the bubbles flow out of the hollow interior 40 of the housing 12 and a second layer 122 of encapsulant 20 is injected through the lower end cap 18 and into the remaining air-space within the hollow interior 40 of housing 12. This encapsulant 20 fills most if not all of the voids and spaces within the hollow interior 40 thereby providing an additional contaminant and water proofing barrier. In one arrangement, this second layer 122 of encapsulant 20 is over-flowed, that is more encapsulant 20 is forced into the hollow interior 40 of the housing 12 such that the excess escapes out the opposite end of the housing 12 and in doing so, excess air bubbles are forced out of the hollow interior 40. The encapsulant 20 is left to cure over time. Once cured the light bar 10 is ready for use.

When encapsulant 20 is properly injected within the hollow interior 40 of housing 12, the second layer 122 of encapsulant 20 fills all of the air space left within the hollow interior 40 of housing 12. In one arrangement, the second layer 122 surrounds all portions of the circuit board 14 and engages the entire exterior surface of the circuit board 14 as well as engages the entire interior surface of the hollow interior 40 of housing 40. By filling all of the air space within the hollow interior 40 of housing 12 after the circuit board 14 has been inserted within the hollow interior 40 this prevents any water or contamination from getting into the hollow interior 40 by filling this space already. In addition, even if water or contaminants did get into the hollow interior 40 of housing 40 this water and/or contaminants would not be able to get to the circuit board 14 itself as the circuit board 14 is fully encapsulated within the second layer 122 of encapsulant 20. In addition, the LEDs 46 are also encapsulated by the first layer 120 or encapsulant 20 thereby providing a second layer of protection. This these first and second layers 120, 122 of encapsulant 20 are protected by being housed within the sealed housing 12 thereby protecting the encapsulant 20 from exposure to water and contaminants not to mention physical contact and abuse. By forming the housing 12 out of a single continuous extrusion, this prevents water or contaminants from getting into housing 12 except for the ends which are covered by end caps 18 that are sealed in place and then sealed again with second layer 122 of encapsulant 20. In way, a light bar system 10 is provided that is extremely durable and practically impenetrable.

Chip-On-Board LEDs:

In one arrangement, LEDs 46 are what are known as Chip-On-Board LEDs. COB LED technology describes the mounting of a bare LED chip in direct contact with the substrate to produce LED arrays. It is a method of LED packaging which has a number of advantages over traditional surface mount technologies such as the use of "T-pack" and Surface mount LEDs.

Due to the small size of the LED chip, Chip-on-Board technology allows for a much higher packing density than surface mount technology. This results in higher intensity & greater uniformity of light for the user.

COB light source can save about 30% cost in the application, mainly lie in LED package cost, light engine production costs and the secondary light distribution costs, which is of great significance for many applications. In performance, through the rational design and micro-lens molding, a COB light module can avoid the defects of point and glare light and other deficiencies of prior art LEDs. COB modules make the production of lighting simpler and more-convenient, and reduce costs effectively. In production, existing technology and equipment can support high yield and large-scale COB module manufacturing, assembly and installation. As such, the use of COB LEDs provides many advantages including brighter illumination and an appearance of a single continuous light instead of a plurality of individual lights.

Control Box Algorithm and Operation:

One problem associated with adding a light bar 10 having red, white and amber LEDs 46 is that a break light signal and a turn signal from the vehicle's electrical system is indistinguishable, but it is desirable for the light bar 10 to illuminate the amber LEDs 46A on the appropriate segment 16 of the light bar 10 for a turn signal while it is desirable to illuminate the red LEDs 46R of both segments 16 for a break light. In addition, to provide the maximum visibility and safety, it is desirable to illuminate both the red LEDs 46R of a segment 16 and the amber LEDs 46A when the breaks are applied while the turn signal is on. Yet, again, in many applications, the break and turning signals are indistinguishable from one another as they merely appear as power to a line through plug 60.

To accomplish this functionality, and separate the turn signals from break signals, microprocessor 64 and memory 66 of control box 22 use an algorithm that is capable of determining whether a signal is a break signal or a turn signal and from this determination the control box 22 illuminates the appropriate segment(s) 16 of light bar 10 and the appropriate color(s) of LEDs 46.

More specifically, in one arrangement, control box 22 receives power and four electrical operational signals from the electrical system of the vehicle 30. These four operational signals are: (1) a tail light signal (which is a low power signal on both the right tail light lead and the left tail light lead), (2) a reverse light signal, (3) a left blinker/brake signal, and (4) a right blinker/brake signal.

The reverse signal is simply a pass through signal. That is, when the reverse signal is received, the white LEDs 46W of both segments 16 are illuminated. Similarly, the tail light signal (meaning that the tail lights of the vehicle are to be illuminated at a low level, such as when the headlights are on) is also a pass through signal. That is, when the tail light signal is received, the red LEDs 46R of both segments 16 are illuminated, at a low illumination level. As such, there is essentially no need to perform processing on the reverse light signal and/or the tail light signal.

However, processing is required to determine whether a signal is a turn signal or a break signal. The algorithm processes three functions passed along in two wires; left turn signal which is represented as a blinking signal on the left signal lead; right turn signal which is represented as a blinking signal on a right signal lead; and brake signal which is represented as a solid or continuous signal simultaneously present on both the left and right signal leads. The right and left turn signals are mutually exclusive, but the brake signal can be present at any time for any duration.

The software algorithm uses memory of the current state and the recent past state of the right signal lead and the left signal lead to determine what function is most likely active at a point in time. That is whether it is a break signal or a turn signal. The algorithm observes the rate at which a turn signal is flashing to estimate when the next signal should arrive, and the algorithm acts accordingly if that signal either does or does not arrive. The software contains a state machine to take care of most situations, and also employs timers to keep certain states from running too long.

In addition, the algorithm adapts to the speed of the turn signal for each vehicle, so that if a nondeterministic state is incorrectly determined, the function only lasts the minimum time necessary. This reduces the time that an erroneous output is displayed (an output that may not be in sync with the vehicle). For example, a brake released at just the right time may activate an errant turn signal, e.g. flash of the amber LEDs 46A of a segment 16. This functionality adds to the universal nature of the light bar.

As such, the control box 22 extrapolates these four electrical operational signals from the electrical system of vehicle 30 into the following functions using an algorithm:

Break Light: The control box 22 detects a simultaneous solid high-intensity illumination on both the right signal lead and the left signal lead. The control box 22 outputs a high intensity illumination on both segments 16 of red LEDs 46R.

Breaks Applied and Right Turn Signal Active: The control box 22 detects a constant signal on left turn signal lead and intermittent signal on the right turn signal lead. The control box 22 outputs a high intensity illumination on both segments 16 of red LEDs 46R while simultaneously outputting a flashing illumination of the amber LEDs 46A on the right segment 16 of light bar 10.

Breaks Applied and Left Turn Signal Active: The control box 22 detects a constant signal on right turn signal lead and intermittent signal on the left turn signal lead. The control box 22 outputs a high intensity illumination on both segments 16 of red LEDs 46R while simultaneously outputting a flashing illumination of the amber LEDs 46A on the left segment 16 of light bar 10.

No Break Applied and Right Turn Signal Active: The control box 22 does not detect a signal on the left turn signal lead while detecting an intermittent signal on the right turn signal lead. The control box 22 outputs a flashing illumination of the amber LEDs 46A on the right segment 16 of light bar 10.

No Break Applied and Left Turn Signal Active: The control box 22 does not detect a signal on the right turn signal lead while detecting an intermittent signal on the left turn signal lead. The control box 22 outputs a flashing illumination of the amber LEDs 46A on the left segment 16 of light bar 10.

Hazards: Detecting hazards is equivalent to detecting a break light signal. That is, the control box 22 detects a simultaneous solid high-intensity illumination on both the right signal lead and the left signal lead. The control box 22 outputs a high intensity illumination on both segments 16 of red LEDs 46R. In one arrangement, a timer function is used to detect the periodic illumination on both the right signal lead and the left signal lead and microprocessor 64 determines that this continued cycling of this signal is indeed a hazard signal and the microprocessor 64 instead illuminates that amber LEDs 46A until the periodic cycling ceases.

From the foregoing, it can be seen that the present invention accomplishes at least all of the stated objectives.

LIST OF REFERENCE NUMERALS

The following list of reference numerals is provided to facilitate an understanding and examination of the present disclosure and is not exhaustive. Provided it is possible to do so, elements identified by a numeral may be replaced or used in combination with any elements identified by a separate numeral. Additionally, numerals are not limited to the descriptors provided herein and include equivalent structures and other objects possessing the same function.

10 light bar system
12 housing
14 circuit board
16 segments
18 end caps
20 encapsulant
22 control box
24 microprocessor
26 memory
28 clips
30 truck or vehicle
32 backwall
34 sidewalls
36 cover portion
38 features
40 hollow interior
42 front transparent portion
44 back non-transparent portion
46 LEDs
48 backing material
50 circuitry layer
54 seamline
55 exterior facing surface
56 wiring
58 fuse
60 plug
62 signal lead
64 microprocessor
66 memory
68 high efficiency step down controller
100 backwall
102 opposing end walls
104 opposing side walls
106 rearward face
108 rearward face
110 arms
112 locking feature
114 guiding surface
116 opening
120 first layer
122 second layer

What is claimed is:

1. A vehicle light bar, comprising:
   a circuit board positioned within a housing and having a plurality of light emitting diodes (LEDs) configured to transmit light from an outward facing surface of the circuit board;
   the housing having wiring electrically connected to a control box, said control box including logic for automatically illuminating independently controllable segments of the vehicle light bar and a microprocessor programmed to override the automatic illumination of the independently controllable segments of the vehicle light bar.

2. The vehicle light bar of claim 1, wherein space between the outward facing surface of the circuit board and an inward facing surface of the housing is filled with an encapsulant thereby sealing the LEDs within the housing.

3. The vehicle light bar of claim 2, wherein the encapsulant is formed of a flowable plastic injected into space between the outward facing surface of the circuit board and the inward facing surface of the housing.

4. The vehicle light bar of claim 1, wherein a portion of the housing covering the LEDs is formed of a transparent or translucent plastic material.

5. The vehicle light bar of claim 1, wherein the housing is formed of a back wall, a pair of opposing sidewalls and a cover, wherein the cover is formed of a convex curved shape.

6. The vehicle light bar of claim 1, wherein the outward facing surface of the circuit board is black in color thereby minimizing the noticeability of the vehicle light bar when not in operation.

7. The vehicle light bar of claim 1, wherein the LEDs are chip-on-board LEDs.

8. The vehicle light bar of claim 1, wherein the wiring includes a fuse and a signal lead.

9. The vehicle light bar of claim 8, wherein the control box is initially configured to automatically illuminate some of the red LEDs while a vehicle is braking, illuminate some of the amber LEDs while the vehicle is turning, and illuminate some of the white LEDs while the vehicle is driven in reverse.

10. The vehicle light bar of claim 1, wherein the wiring comprises gold.

11. The vehicle light bar of claim 10, wherein a manual instruction sent from an operator instructs the microprocessor to override the automatic illumination of independently controllable segments of the vehicle light bar with a strobing pattern selected from the group consisting of an emergency strobing pattern and a work light strobing pattern.

12. The vehicle light bar of claim 11 in combination with a wireless remote that sends an input containing the manual instruction to the vehicle light bar.

13. The vehicle light bar of claim 1, wherein the circuit board includes three rows of LEDs, wherein at least one row is formed of red LEDs, at least one row is formed of amber LEDs, and at least one row is formed of white LEDs.

14. A method of manufacturing a vehicle light bar, the steps comprising:
   positioning a circuit board having a plurality of light emitting diodes (LEDs) configured to transmit light from an outward facing surface of the circuit board within a housing;
   filling the space between the outward facing surface of the circuit board and an inward facing surface of the housing with an encapsulant;
   sealing the LEDs within the housing;
   providing a control box including logic for automatically illuminating independently controllable segments of the vehicle light bar and a microprocessor programmed to override the automatic illumination of the independently controllable segments of the vehicle light bar; and
   electrically separating the circuit board into independently controllable segments.

15. The method of claim 14, wherein the filling step comprises:

flowing a first layer of encapsulant over the outward facing surface of the circuit board having a plurality of LEDs; and allowing the first layer of encapsulant to cure thereby sealing the LEDs of the circuit board prior to positioning the circuit board within the housing.

16. The method of claim 15, wherein the filling step further comprises flowing a second layer of encapsulant into the housing after the circuit board is positioned within the housing.

17. A vehicle light bar for installation on a vehicle having an electrical system, comprising:

a circuit board positioned within a housing and having a plurality of light emitting diodes (LEDs) configured to transmit light from an outward facing surface of the circuit board; and a controller electrically connected to the electrical system of the vehicle, electrically connected to the vehicle light bar, and having a microprocessor and memory;

wherein the controller is configured to receive signals from the electrical system of the vehicle, interpret the signals received from the electrical system of the vehicle, and in response automatically control illumination of independently controllable segments of the vehicle light bar; and wherein the controller includes logic for automatically illuminating independently controllable segments of the vehicle light bar and a microprocessor programmed to override the automatic illumination of the independently controllable segments of the vehicle light bar.

18. The vehicle light bar of claim 17, wherein the controller is further configured to select between colors of LEDs in response to receiving the signals from the electrical system of the vehicle.

19. The vehicle light bar of claim 17, wherein the controller is further configured to select the duration of illumination of LEDs in response to receiving the signals from the electrical system of the vehicle.

20. The vehicle light bar of claim 17, wherein the logic is tied into the electrical system of the vehicle such that both the LEDs on the vehicle light bar and the external lights of the vehicle are synced.

\* \* \* \* \*